(12) United States Patent
Phillips et al.

(10) Patent No.: US 6,987,559 B2
(45) Date of Patent: Jan. 17, 2006

(54) VIBRATION-ATTENUATION DEVICES HAVING LOW LATERAL STIFFNESS, AND EXPOSURE APPARATUS COMPRISING SAME

(75) Inventors: Alton H. Phillips, Saitama (JP); Hideaki Sakamoto, Saitama (JP); Michael B. Binnard, Belmont, CA (US)

(73) Assignee: Nikon Corporation, Tokyo (JP)

( * ) Notice: Subject to any disclaimer, the term of this patent is extended or adjusted under 35 U.S.C. 154(b) by 195 days.

(21) Appl. No.: 10/272,195

(22) Filed: Oct. 15, 2002

(65) Prior Publication Data

US 2004/0080729 A1 Apr. 29, 2004

(51) Int. Cl.
*G03B 27/62* (2006.01)
*G03B 27/72* (2006.01)
*G03B 27/42* (2006.01)

(52) U.S. Cl. .............................. 355/75; 355/72; 355/53; 355/76

(58) Field of Classification Search .................. 355/75, 355/53, 72, 237.2; 310/90.5, 90, 91, 12; 384/123; 356/237.2
See application file for complete search history.

(56) References Cited

U.S. PATENT DOCUMENTS 5,701,041 A 12/1997 Akutsu et al.
6,144,442 A 11/2000 'T Mannetje et al.
6,226,075 B1 5/2001 Loopstra et al.
6,600,547 B2 7/2003 Watson et al.

FOREIGN PATENT DOCUMENTS

| EP | 0973067 | 7/1999 |
| EP | 11602628 | 5/2001 |
| JP | 62-60568 | 12/1987 |

*Primary Examiner*—Peter B. Kim
(74) *Attorney, Agent, or Firm*—Klarquist Sparkman, LLP

(57) ABSTRACT

Devices are disclosed for placement between first and second masses for attenuating transmission of motions from one of the masses to the other. A general embodiment of such a device includes a fluid isolator and a lateral fluid bearing situated along a support axis. The fluid isolator includes a housing defining an isolator chamber pressurized with a gas at pressure $P_{isol}$. The fluid isolator is situated such that motion of the masses relative to each other along the support axis is at the fluid isolator, and lateral motion is at the lateral fluid bearing. The lateral fluid bearing includes first and second bearing surfaces that are transverse to the support axis. At least one such surface defines three channels: pressure channel, atmospheric pressure channel, and vacuum channel. In order from the isolator chamber, the pressure channel (at pressure $P_{XYbearing} \approx P_{isol}$) is first, the atmospheric pressure channel (at pressure $P_{atm}$) is second, and the vacuum channel (at pressure $P_{vac}$) is third. From this general embodiment, a number of configurations are possible.

39 Claims, 16 Drawing Sheets

VIBRATION-ATTENUATION DEVICES HAVING LOW LATERAL STIFFNESS, AND EXPOSURE APPARATUS COMPRISING SAME

FIELD

This disclosure pertains generally to the attenuation of vibrations and other movements from one physical body to another.

BACKGROUND

The general problem of preventing the transmission of vibration and other movements from one body to another dates back to the dawn of the machine age. The development of increasingly complex machines has resulted in the ubiquitous utilization in such machines of any of various approaches to solving this problem. Increases in the accuracy of tasks performed by various machines have demanded increasingly sophisticated or more tailored approaches to reducing transmission of vibrations and the like from one portion of the machine to another and/or to a workpiece upon which a machine is performing a task. Also, addressing the general problem of arresting transmission of vibrations and other movements from an external source to a machine has become more important.

An example of a machine technology in which demands on accuracy and precision are extreme is microlithography as used, for example, in the manufacture of microelectronic devices (e.g., integrated circuits). Microlithography involves the transfer of a pattern, used to define a layer of a microelectronic device, onto a sensitized surface of a suitable substrate such as a semiconductor wafer. Hence, microlithography is analogous to an extremely sophisticated photographic printing process. Modern microlithography systems (commonly called "steppers") are capable of imprinting patterns in which the pattern elements, as imaged on the substrate, have linewidths at or about the wavelength of light used to form the image. For example, certain modern steppers can form images of linear pattern elements having a linewidth of 0.25 or 0.18 $\mu$m, or even smaller, on the substrate. Achieving such a high level of performance requires that all imaging, positioning, and measuring systems of the stepper operate at their absolute limits of performance. This also requires that vibrations and other unwanted physical displacements be eliminated from the machine.

A conventional approach to vibration attenuation between two physical bodies involves the use of one or more air springs between the bodies. An air spring is a spring device in which the energy-storage element is air that is confined in a container that includes an elastomeric bellows or diaphragm. Air springs are commercially available in many different configurations and sizes and are used in a wide variety of applications with good success. A key attribute of an air spring is its reduced stiffness with respect to the load applied to the air spring. (Usually the load is applied axially relative to the air spring.) For many applications (e.g., trucks and other heavy machinery), especially in situations in which attenuation of axial motion is the objective, an air spring is sufficient for achieving satisfactory vibration attenuation.

A disadvantage of an air spring for certain applications is its relatively high lateral stiffness. The high lateral stiffness can result in significant transmission via the air spring of non-axial motions from one body to another. If the subject machine is one (e.g., a stepper) in which and/or from which substantially all vibrations must be isolated completely, an air spring will exhibit unsatisfactory performance. For example, in a stepper machine any significant lateral stiffness in a vibration-attenuation device can cause problems with overlay accuracy of different layers as imaged on a wafer. Another possible problem is an increased mean standard displacement ("MSD") between the reticle stage and the wafer stage.

Increasing the axial length of certain types of air springs can reduce their lateral stiffness. However, making an air spring longer may render certain uses of it impossible. This problem has arisen in modem stepper machines in which, despite the large size of a stepper machine, spaces between components and assemblies of the machine are usually very tight. For example, in most stepper machines the height of the focal plane of the projection lens above the floor of the room containing the machine is dictated by the height of adjacent robotics for transporting wafers to and from the machine. The dictated height usually is about 600 mm above the floor (which is a standard elevation in the industry). This 600-mm space must accommodate the massive wafer stage and its movement mechanisms, as well as various large support members for the stage, projection lens, and other portions of the machine. Under such conditions, the remaining available space simply is inadequate for accommodating air springs sized for achieving satisfactory performance.

Hence, in modem stepper machines and related types of equipment, there is a need for vibration attenuators and analogous supporting devices that exhibit good vibration attenuation in the axial direction and that exhibit substantially zero lateral stiffness to reduce transmission of vibrations between any of various portions of the machine, especially at certain vibration frequencies.

Various examples exist in the known art for addressing the problem of achieving improved vibration attenuation in a stepper machine. For example, U.S. Pat. Nos. 6,144,442 and 6,226,075 discuss respective "supporting devices" having low stiffness in a directions parallel to a support direction and perpendicular to the support direction. Other approaches to solving this problem are discussed in U.S. Pat. No. 5,701,041 and in European Patent Publication Nos. EP 0,973,067 A2 and EP 1,160,628 A2. However, in view of the extremely demanding application to which vibration-attenuation devices are put in modem stepper machines, all of the currently known vibration-attenuation devices fall short of satisfying all performance criteria for such applications. Further improvement is needed.

SUMMARY

The foregoing needs are addressed by vibration-attenuation devices according to various aspects of the invention. The vibration-attenuation devices are configured especially for placement along a support axis between a first mass and a second mass, and serve to attenuate transmission of motion from one of the masses to the other of the masses.

A first embodiment of the subject vibration-attenuation devices comprises a fluid isolator and a lateral fluid bearing situated along the support axis. The fluid isolator comprises a housing defining an isolator chamber configured to be pressurized with a fluid (e.g., a gas) at a pressure $P_{isol}$. The fluid isolator is situated and configured relative to the first mass, the second mass, and the lateral fluid bearing such that motion of the masses relative to each other along the support axis is at the fluid isolator, and lateral motion of the masses relative to each other is at the lateral fluid bearing. The lateral fluid bearing comprises first and second bearing surfaces oriented transversely to the support axis. At least one of the first and second bearing surfaces defines a pressure channel, an atmospheric pressure channel, and a vacuum channel. The pressure channel is situated the closest of the channels to the isolator chamber and pressurized at a pressure $P_{XYbearing}$ substantially equal ($\approx$) to $P_{isol}$. The vacuum channel is situated the farthest of the channels from the isolator chamber and is evacuated to a vacuum $P_{vac}$. The atmospheric pressure channel is situated between the pressure channel and the vacuum channel and is vented to atmospheric pressure $P_{atm}$.

In the foregoing general embodiment the pressure channel desirably is separated from the isolator chamber by an inner rib, and the vacuum channel desirably is separated from the isolator chamber by the inner rib as well as first and second intermediate ribs. The atmospheric pressure channel desirably is separated from the pressure channel and the vacuum channel by the first and second intermediate ribs, respectively.

The housing of the fluid isolator can comprise a first housing portion coupled to the first mass, and a second housing portion coupled to the second mass. In this configuration the lateral fluid bearing is situated between the first and second housing portions such that the first housing portion is coupled to the first bearing surface and the second housing portion is coupled to the second bearing surface.

The second housing portion can include a spherical bearing situated between the lateral fluid bearing and the second mass. In such a configuration the spherical bearing can be defined by first and second spherical bearing surfaces of the second housing portion. Desirably, at least one of the first and second spherical bearing surfaces defines a pressure channel pressurized to a pressure $P_{\theta XYbearing}$ substantially equal to $P_{isol}$, an atmospheric pressure channel vented to atmospheric pressure $P_{atm}$, and a vacuum channel evacuated to a vacuum $P_{vac}$.

The first housing portion can comprise a fluid bearing oriented along the support axis and a piston movable along the support axis relative to the first housing portion. This configuration can include a compliant member situated between the first mass and the piston.

The first housing portion can be configured to define an axial fluid bearing oriented along the support axis. The axial fluid bearing in this configuration comprises a piston that is movable along the support axis relative to the first housing portion. The axial fluid bearing is defined by an axial bearing surface of the first housing portion and an axial bearing surface of the piston. Desirably, at least one of the axial bearing surfaces defines a channel configured to be pressurized to a hyperatmospheric pressure $P_{Zbearing}$. The piston can comprise a first portion and a second portion, wherein the first portion is coupled to the first mass and the second portion defines one of the axial bearing surfaces. The first and second portions define a spherical bearing between them.

The configuration summarized in the preceding paragraph can further include a base support and a flexible diaphragm situated coaxially with the second housing portion. The flexible diaphragm extends from and connects the second housing portion to the base support. At least one actuator can be situated so as to apply a force to the second housing portion relative to the base support. The force desirably is sufficient in magnitude and direction to cause the second housing portion to exhibit a corresponding tilt relative to the base support. Alternatively, at least one compliant member can be situated so as to provide compliant contact of the second housing portion with the second mass and configured to allow the second housing portion to tilt relative to the axis in response to a non-axial force applied to the second housing portion.

The general embodiment summarized above can further comprise a first flexible diaphragm situated coaxially with the first housing portion and that defines, collectively with the first and second housing portions, the isolator chamber. This configuration can further include a base support and a second flexible diaphragm situated coaxially with the second housing portion, wherein the second flexible diaphragm extends from and connecting the second housing portion to the base support. This configuration can further include at least one actuator situated so as to apply a force to the second housing portion relative to the base support. The force is sufficient in magnitude and direction to cause the second housing portion to exhibit a corresponding tilt relative to the base support. Furthermore, the base support can define a cavity that is open to the isolator chamber.

The general embodiment summarized above can further comprise a flexible diaphragm situated coaxially with the housing. The diaphragm defines, collectively with the housing, the isolator chamber. The housing can be connected via the flexible diaphragm to the first mass.

In the general embodiment summarized above, the first bearing surface can be defined on a surface of the housing external to the isolator chamber. In this configuration the second bearing surface can be defined on a surface of the second housing situated, coaxially with the housing of the fluid isolator, between the first bearing surface and the second mass. The second housing and first bearing surface collectively define a second chamber that is configured for pressurization with a gas at a pressure $P_{XYbearing}$. Desirably, $P_{XYbearing} \approx P_{isol}$. This configuration can further comprise a spherical fluid bearing situated axially between the second housing and the second mass. This configuration can further include at least one actuator situated so as to apply a force to the second housing relative to the second mass. The force is sufficient in magnitude and direction to cause the second housing to exhibit a corresponding tilting motion on the spherical bearing relative to the second mass.

Another embodiment of a device for attenuating vibration between a first mass and a second mass comprises a chamber housing having a first surface configured to be coupled to the second mass, and a neck portion extending along a support axis away from the first surface. The neck portion defines an opening. A first flexible diaphragm is attached to the circumference of the neck portion. A first lateral bearing member is attached circumferentially to the first flexible diaphragm, wherein the first lateral bearing member includes a first bearing surface extending transversely relative to the support axis. The device includes a second lateral flexible diaphragm and a second bearing member including a second bearing surface situated axially opposite and parallel to the first bearing surface. The second lateral bearing member is attached circumferentially to the second flexible diaphragm and defines, together with the chamber housing, the first flexible diaphragm, the first lateral bearing member, and the second diaphragm, an isolator chamber. A mounting plate is attached to the center of the second flexible diaphragm and is configured to be coupled to the first mass. The isolator chamber is configured for pressurization with a gas at a hyperatmospheric pressure $P_{isol}$. The pressure is sufficient to support the first and second masses relative to each other along the support axis.

In this embodiment one of the first and second bearing surfaces defines at least a first channel that opens into the fluid bearing and is configured to be pressurized with a gas at a hyperatmospheric pressure $P_{XYbearing}$. Desirably, $P_{XYbearing} \approx P_{isol}$. The first channel can be defined in the second bearing surface. The second bearing surface also can define separate second and third channels that open into the lateral fluid bearing. The second and third channels are configured to have respective gas pressures of atmospheric pressure ($P_{atm}$) and subatmospheric pressure ($P_{vac}$), respectively. In this configuration the first channel is located closest to the isolator volume, the third channel is located farthest from the isolator volume, and the second channel is located between the first and third channel. Desirably, the pressure channel is separated from the isolator chamber by an inner rib, the vacuum channel is separated from the isolator chamber by the inner rib as well as first and second intermediate ribs, and the atmospheric pressure channel is separated from the pressure channel and the vacuum channel by the first and second intermediate ribs, respectively.

The chamber housing can further comprise a second surface facing in a direction opposite the first surface. In this configuration, the device can further comprise multiple actuators situated at respective locations between the second surface of the chamber housing and the lateral fluid bearing. The actuators desirably can be actuated in a selective manner so as to impart a tilt of the lateral fluid bearing relative to the chamber housing.

Yet another embodiment of a device for attenuating vibration between a first mass and a second mass comprises, along a support axis extending in the Z-direction, a chamber housing comprising a base wall configured to be coupled to the second mass, and a side wall including a distal edge. A flexible diaphragm is attached concentrically to the distal edge. A first XY-bearing member is attached circumferentially to the flexible diaphragm, wherein the first XY-bearing member defines a first XY-bearing surface. A second XY-bearing member defines a second XY-bearing surface facing the first XY-bearing surface. The second XY-bearing member also defines a first Z-bearing surface extending axially with the support axis in the Z-direction. The device includes a piston defining a second Z-bearing surface that is complementary to the first Z-bearing surface and extends axially with the support axis in the Z-direction. The piston also defines a distal surface situated and configured to be coupled to the first mass. The chamber housing, flexible diaphragm, first XY-bearing member, second XY-bearing member, and piston collectively define a chamber configured to be pressurized with a gas at a hyperatmospheric pressure $P_{isol}$. The pressure is sufficient to support, along the support axis, the collective masses of the piston and first mass relative to the mass of the second mass. At least one of the XY-bearing surfaces defines therein a first channel that opens into the XY fluid bearing and that is configured to be pressurized with a gas at a hyperatmospheric pressure $P_{XYbearing}$, a second channel that opens into the XY fluid bearing and that is configured to have an atmospheric gas pressure $P_{atm}$, and a third channel that opens into the XY fluid bearing and that is configured to be evacuated to a subatmospheric pressure ($P_{vac}$). The first channel is located closest to the chamber, the third channel is located farthest from the chamber, and the second channel is located between the first and third channels. Desirably, $P_{XYbearing} \approx P_{isol}$. The device can further comprise a flexible member that couples the first mass to the distal surface of the piston. The first Z-bearing surface can define a channel that opens into the Z fluid bearing and that is configured to be pressurized with a gas at a hyperatmospheric pressure $P_{Zbearing}$. Desirably, $P_{Zbearing} \approx P_{isol}$.

This device can further comprise at least one actuator that is situated and configured to impart a tilt of the XY fluid bearing relative to the support axis. The device can further comprise at least one compliant member situated and configured to allow the XY fluid bearing to tilt relative to the support axis. The piston can further comprise a spherical bearing situated between the first mass and the Z fluid bearing.

Yet another device for attenuating vibration between a first mass and a second mass comprises a chamber housing comprising a base wall (configured to be coupled to the second mass), a side wall, and a concave spherical bearing surface facing a direction axially opposite the base wall. The device includes a first XY-bearing member that comprises a convex spherical bearing surface that is complementary to the concave spherical bearing surface, and a first XY-bearing surface that faces a direction axially opposite the convex spherical bearing surface. The device further includes a second XY-bearing member that defines a second XY-bearing surface facing the first XY-bearing surface. The second XY-bearing member also defines a first Z-bearing surface that extends axially with the support axis in the Z-direction. A piston, defining a second Z-bearing surface complementary to the first Z-bearing surface, extends axially with the support axis in the Z-direction. The piston also defines a distal surface situated and configured to be coupled to the first mass. The chamber housing, first XY-bearing member, second XY-bearing member, and piston collectively define a chamber configured to be pressurized with a gas at a hyperatmospheric pressure $P_{isol}$. The pressure is sufficient to support, along the support axis, the collective masses of the piston and first mass relative to the mass of the second mass. The gas forms an XY fluid bearing between the first and second XY-bearing surfaces, a Z fluid bearing between the first and second Z-bearing surfaces, and a $\theta_{XY}$ fluid bearing between the first and second spherical bearing surfaces. At least one of the XY-bearing surfaces defines therein a first channel that opens into the XY fluid bearing and that is configured to be pressurized with a gas at a hyperatmospheric pressure $P_{XYbearing}$, a second channel that opens into the XY fluid bearing and that is configured to have an atmospheric gas pressure $P_{atm}$, and a third channel that opens into the XY fluid bearing and that is configured to be evacuated to a subatmospheric pressure $P_{vac}$. The first channel is located closest to the chamber, the third channel is located farthest from the chamber, and the second channel is located between the first and third channels. Desirably, $P_{XYbearing} \approx P_{isol}$.

The concave spherical bearing surface can define therein a first channel that opens into the $\theta_{XY}$ fluid bearing and that is configured to be pressurized with a gas at a hyperatmospheric pressure $P_{\theta XYbearing}$, a second channel that opens into the $\theta_{XY}$ fluid bearing and that is configured to have an atmospheric gas pressure $P_{atm}$, and a third channel that opens into the $\theta_{XY}$ fluid bearing and that is configured to be evacuated to a subatmospheric pressure ($P_{vac}$). The first channel of the $\theta_{XY}$ fluid bearing is located closest to the chamber, the third channel of the $\theta_{XY}$ bearing is located farthest from the chamber, and the second channel of the $\theta_{XY}$ bearing is located between the first and third channels. Desirably, $P_{\theta XYbearing} \approx P_{isol}$.

The first Z-bearing surface can define a channel that opens into the Z fluid bearing and that is configured to be pressurized with a gas at a hyperatmospheric pressure ($P_{Zbearing}$). Desirably, $P_{Zbearing} \approx P_{isol}$.

The device can further comprise a flexible member that couples the first mass to the distal surface of the piston.

A device for supporting a first mass relative to a second mass according to yet another embodiment includes a fluid isolator and a fluid bearing, both of which are situated along a support axis between the first mass and the second mass. The fluid isolator includes a housing defining an isolator chamber that is configured to be pressurized with a fluid at a predetermined pressure sufficient to support the first and second masses relative to each other along the support axis. The fluid bearing is situated and configured to allow relative movement between the first and second masses in a direction that intersects the support axis. The fluid bearing includes first and second bearing surfaces oriented substantially transversely to the support axis, with at least one of the first and second bearing surfaces defining a first pressure conduit and a second pressure conduit. The first pressure conduit desirably is situated the closest of the conduits to the isolator chamber and pressurized at a first pressure substantially equal to the predetermined pressure of the fluid isolator. The second pressure conduit desirably is situated the farthest of the conduits from the isolator chamber and pressurized at a second pressure less than the first pressure.

In particular embodiments, a third pressure conduit is defined in at least one of the first and second bearing surfaces. The third pressure conduit desirably is situated between the first pressure conduit and the second pressure conduit, and is pressurized at a third pressure intermediate the first pressure and the second pressure.

In addition, the device may include at least one positioning device, such as a Lorentz-force motor, configured to generate a moving force for causing movement of the first and second masses relative to each other along a moving axis parallel to the support axis. In this regard, the device may be referred to as a "combination vibration-attenuation/positioning device" because it combines the functions of a vibration-attenuation device and a positioning device in a single unit. Desirably, the positioning device may be aligned along the support axis so that the moving axis is generally coincident to the support axis. In addition, the positioning device can be positioned within the isolator chamber to provide a compact unit.

Another device for supporting a first mass relative to a second mass comprises a first housing and a second housing. The first and second housings desirably are aligned along a support axis. The first housing is coupled to the first mass and defines a first chamber configured to be pressurized with a first fluid. The second housing is coupled to the second mass and defines a second chamber. The second chamber, fluidly disconnected from the first chamber, is configured to be pressurized with a second fluid. A fluid bearing is defined between adjacent surfaces of the first and second housings, which allows movement of the first and second masses relative to each other in a direction that intersects the support axis. The fluid bearing can be pressurized with fluid discharged from one of the first and second chambers.

In particular embodiments, the fluid bearing is a lateral fluid bearing allowing movement of the first and second masses relative to each other in a direction generally perpendicular to the support axis.

The invention also encompasses lithographic exposure devices that include at least one vibration-attenuation device, as well as objects manufactured using such lithographic exposure apparatus.

The foregoing and additional features and advantages of the invention will be more readily apparent from the following detailed description, which proceeds with reference to the accompanying drawings.

DETAILED DESCRIPTION

This invention is described below in the context of multiple representative embodiments that are intended to be exemplary of various possible configurations. It will be understood that the representative embodiments are not intended to be limiting in any way.

As used herein, "vibration attenuation" encompasses attenuation not only of "vibration" as this term is generally understood in the art (i.e., a continuing periodic change in displacement of a mass relative to a reference), but also attenuation of any of various types of movement of one mass relative to another mass. I.e., the attenuated movement is not limited to reduced continuing periodic motion.

For ease of explanation and depiction, the "support axis" extends in a Z-direction between two masses and serves as a reference axis for any of the various embodiments described herein. Mutually perpendicular directions that are perpendicular to the Z-direction are the X-direction and Y-direction. The X-direction and Y-direction collectively define a plane, termed the "XY-plane" to which the support axis is perpendicular.

As used herein, "lateral" generally means sideways relative to the support axis. "Lateral" motion or "lateral" orientation in this regard includes motion and orientation, respectively, in a direction perpendicular to the support axis, and also includes motion and orientation, respectively, in a direction nearly perpendicular to the support axis, taking into account any existing or applied tilt relative to the support axis, as described below. Similarly, "transverse" generally means crosswise relative to the support axis. For example, the XY plane is transverse to the Z-axis or to the support axis. A "transverse" orientation in this regard includes an orientation in a direction perpendicular to the support axis, and also includes orientations in respective directions nearly perpendicular to the support axis, taking into account any existing or applied tilt relative to the support axis, as described below.

First Representative Embodiment

Figure 1:
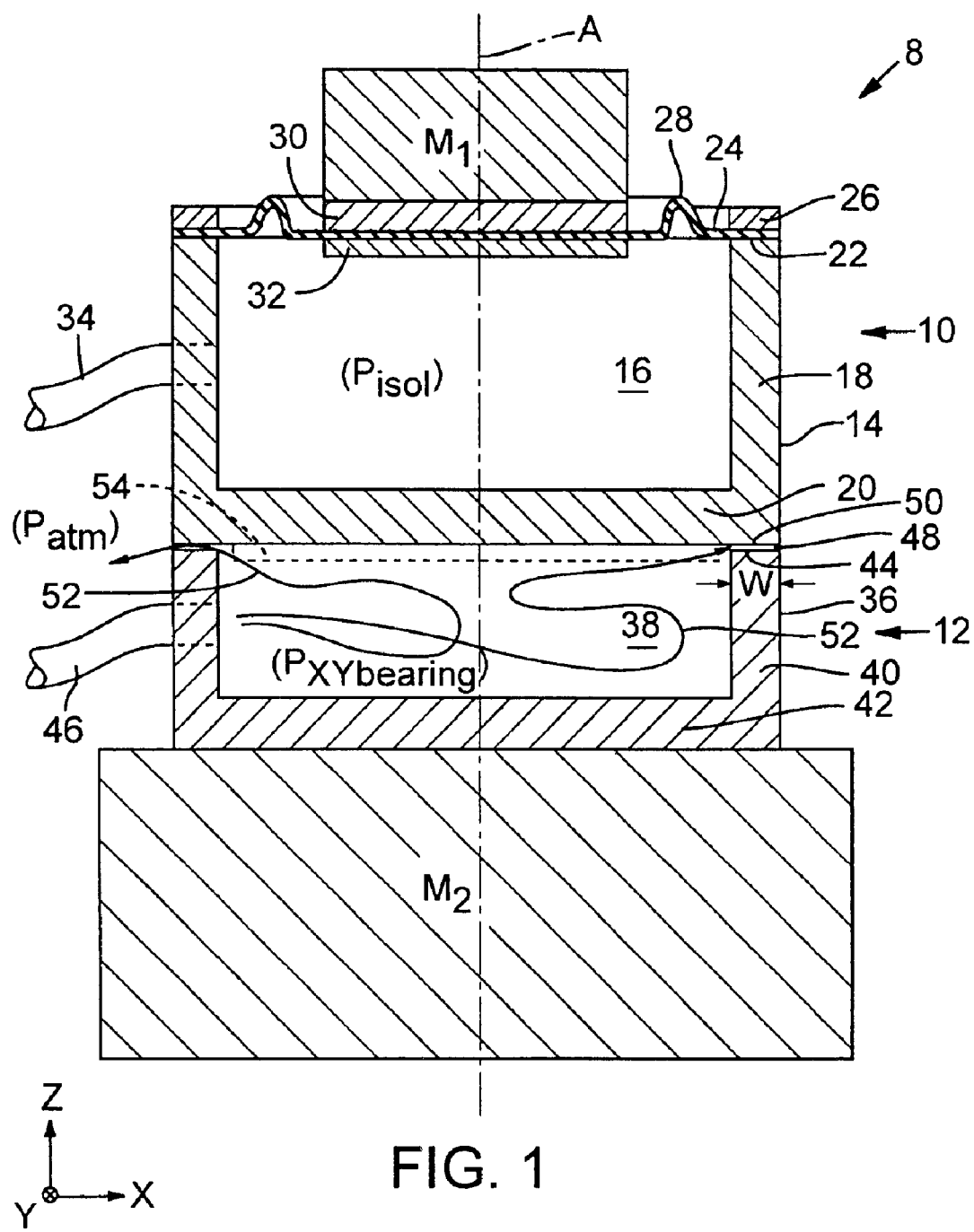
FIG. 1 is an elevational section of a vibration-attenuation device according to a first representative embodiment.

A vibration-attenuation device 8 according to this embodiment is depicted in FIG. 1. The vibration-attenuation device 8 is situated between and contacts a first mass $M_1$ and a second mass $M_2$. By way of example, the masses $M_1$ and $M_2$ can be respective portions of a machine between which it is desired to attenuate vibration, or either mass can be a floor of a building and the other mass can be a machine or portion of a machine. (In FIG. 1 the mass $M_1$ can be regarded as the mass that is "isolated" from the mass $M_2$ by the device 8.)

The vibration-attenuation device 8 comprises an axial fluid-isolator portion 10 and a lateral-fluid-bearing portion 12 that desirably are axially aligned with each other along a support axis A extending parallel to a Z-direction of the device 8 (however, the axial alignment is not to be regarded as limiting). In this embodiment and in any of the other embodiments of vibration-attenuation devices described below, the support axis A need not be on the respective axes of the masses $M_1$ and $M_2$, and the respective axes of the masses $M_1$ and $M_2$ need not be aligned with each other. Also, the support axis A need not be aligned with the direction of acceleration due to gravity.

The fluid-isolator portion 10 comprises a first housing 14 defining an "isolator chamber" 16. The first housing 14 in the depicted configuration includes a side wall 18 and a base wall 20. The first housing 14 can have a cylindrical, rectangular, or other suitable configuration. For example, in the cylindrical configuration the side wall 18 has a circular outside diameter and a circular inside diameter. The side wall 18 includes an edge 22.

The fluid-isolator portion 10 also comprises a flexible diaphragm 24 extending across an open end of the first housing 14 and in sealing engagement with the edge 22. To such end, the fluid-isolator portion 10 can include a sealing ring 26 configured for sealing the perimeter of the diaphragm 24 circumferentially to the edge 22. Thus, the diaphragm 24 fully encloses the isolator chamber 16. The sealing ring 26 can be attached to the edge 22 using screws or other suitable fasteners.

The diaphragm 24 can be any of various commercially available elastomeric (e.g., rubber or rubber composition) used, for example, in air isolators as used in the automotive industry. The diaphragm 24 desirably includes a rolling seal 28 or analogous feature permitting the diaphragm 24 to flex in the axial direction without deforming. As shown, the first mass $M_1$ is situated adjacent the obverse surface of the diaphragm 24, desirably in a coaxial (concentric) manner. To such end, the center portion of the diaphragm 24 is sandwiched between first and second mounting plates 30, 32, respectively, wherein the first mass $M_1$ contacts the first mounting plate 30. Thus, the first mass $M_1$ and the mounting plates 30, 32 collectively function in the manner of a piston relative to the isolator chamber 16, but have more freedom of motion (e.g., limited range of tilt, yaw, and roll relative to the support axis A) than a conventional piston.

During operation the isolator chamber 16 is pressurized with a gas, such as air, at a pressure $P_{isol}$. The gas is discharged into the isolator chamber 16 via a conduit 34 connected to a suitable gas source (not shown). The source can be a regulated pressurized source if desired or necessary. The gas is discharged in the isolator chamber 16 sufficiently to create the desired pressure $P_{isol}$ in the isolator chamber 16. The pressure $P_{isol}$ applies a buoyant force against the diaphragm 24 sufficiently to support the combined mass of the first mass $M_1$, the mounting plates 30, 32, and the center portion of the diaphragm 24 along the support axis A relative to the first housing 14.

The pressurized gas in the isolator chamber 16 is an energy-storage medium for the fluid-isolator portion 10 in the manner of an air spring for attenuating transmission of vibration between the first mass $M_1$ and the second mass $M_2$. Vibration attenuation using the fluid-isolator portion 10 is greater in the axial direction (Z-direction) than in the lateral direction (X-direction or Y-direction) due to the lower stiffness of the fluid-isolator portion 10 in the axial direction compared to the lateral direction.

The fluid-bearing portion 12 is included in the vibration-attenuation device 8 to reduce substantially the lateral stiffness of the device 8. The fluid-bearing portion 12 ("XY bearing") comprises a second housing 36 defining a "bearing chamber" 38. The second housing 36 in the depicted configuration includes a side wall 40 and a base wall 42. The side wall 40 has a distal edge 44, having a width "w", that serves as a bearing surface. The second housing 36 can have a cylindrical, rectangular, or other suitable configuration. For example, in the cylindrical configuration the side wall 40 has a circular outside diameter and a circular inside diameter. The second housing 36 can rest on a second mass $M_2$ (e.g., another machine member, a base member, or a floor of a building).

The bearing chamber 38 is intended for pressurization with a gas, such as air, at a pressure $P_{XYbearing}$. The gas is discharged into the bearing chamber 38 via a conduit 46 connected to a suitable gas source (not shown). The source can be a regulated pressurized source if desired or necessary. The gas is discharged in the bearing chamber 38 sufficiently to create the desired pressure $P_{XYbearing}$ (which may or may not equal $P_{isol}$) in the bearing chamber 38. As the gas enters the bearing chamber 38, the resulting pressurization of the bearing chamber 38 relative to atmospheric pressure $P_{atm}$ results in escape of gas across the distal edge 44, which forms a fluid bearing 48 between the edge 44 and the adjacent under-surface 50 of the base wall 20 (note arrows 52). By way of example only, and not intending to be limiting, this fluid bearing 48 has a "thickness" (i.e., the axial dimension of the cushion of fluid escaping between the surfaces 44 and 50) of about 5 μm.

The fluid bearing 48 supports the combined mass of the fluid-isolator portion 10 and the mass $M_1$ on a thin gas cushion. The gas cushion attenuates transmission of vibration from the mass $M_2$ and second housing 36 to the first housing 14 and mass $M_1$, and similarly in the opposite direction, while allowing the first housing 14 to move in a near frictionless manner (over a limited range in X- and Y-directions) relative to the second housing 36. This near frictionless lateral movement eliminates substantially all lateral stiffness of the vibration-attenuation device 8. I.e., while the fluid-isolator portion 10 is resting on this fluid bearing 48, the entire vibration-attenuating device 8 comprising a combination of the fluid-isolator portion 10 and the fluid-bearing portion 12 exhibits substantially no lateral stiffness.

The width "w" of the distal edge 44 need not be equal to the radial thickness of the side wall 40. In view of the substantial load borne by the fluid bearing 48, the width "w" is greater than the radial thickness of the side wall 40. See, for example, the embodiment of FIG. 3, in which the second end wall has a radial width that is greater than the radial thickness of the side wall 94. In addition, in the embodiment of FIG. 1, one or both the surfaces 44, 50 can be configured so as to define one or more channels, as shown, e.g., in FIG. 4, FIG. 5, or FIG. 6.

The under-surface 50 of the base wall 20 can be provided with a position stop 54 (dashed lines) configured so as to prevent excessive lateral motion of the fluid-isolator portion 10 and lateral-fluid-bearing portion 12 relative to each other.

The position stop 54 can have any practical configuration suitable for its intended purpose. In addition, a suitable stop can be provided to prevent excessive collapse of the mass $M_1$ toward the base wall 20 in the event of insufficient pressure $P_{isol}$ in the isolator chamber 16. In this regard, for example, the base wall 20 can be provided with an extension (not shown) extending upward along the axis A in FIG. 1 and having a distal end situated "beneath" the second mounting plate 32 sufficiently to stop excessive "downward" motion of the mass $M_1$ and mounting plates 30, 32. Such a stop also would prevent excess stress on the flexible diaphragm 24 in the event of insufficient pressure $P_{isol}$.

The chambers 16, 38 can be pressurized to the same pressure (i.e., such that $P_{isol} \approx P_{XYbearing}$) either independently as shown or by defining a gas conduit (not shown) through the base wall 20 connecting the chambers 16, 38 together. The latter configuration allows one of the conduits 34, 46 to be eliminated. The chambers 16, 38 can be pressurized to the same pressure only if the resulting pressure in each chamber produces the proper respective buoyant forces to support the respective masses. For example, in the configuration shown in FIG. 1, the bearing chamber 38 has a larger piston area than the isolator chamber 16. Hence, at the same pressure, the bearing chamber 38 will exert a greater thrust force than the isolator chamber 16. To achieve equilibrium in such a situation, the masses and/or piston areas are adjusted properly relative to each other.

The first housing 14 and second housing 36 can be made of any of various rigid materials, depending upon the conditions of use and other factors. For example, these components can be fabricated from any of various metals such as hardened steel, stainless steel, or aluminum, ceramic materials, or rigid polymeric materials. The first and second housings need not be made of the same material.

Second Representative Embodiment

Figure 2:
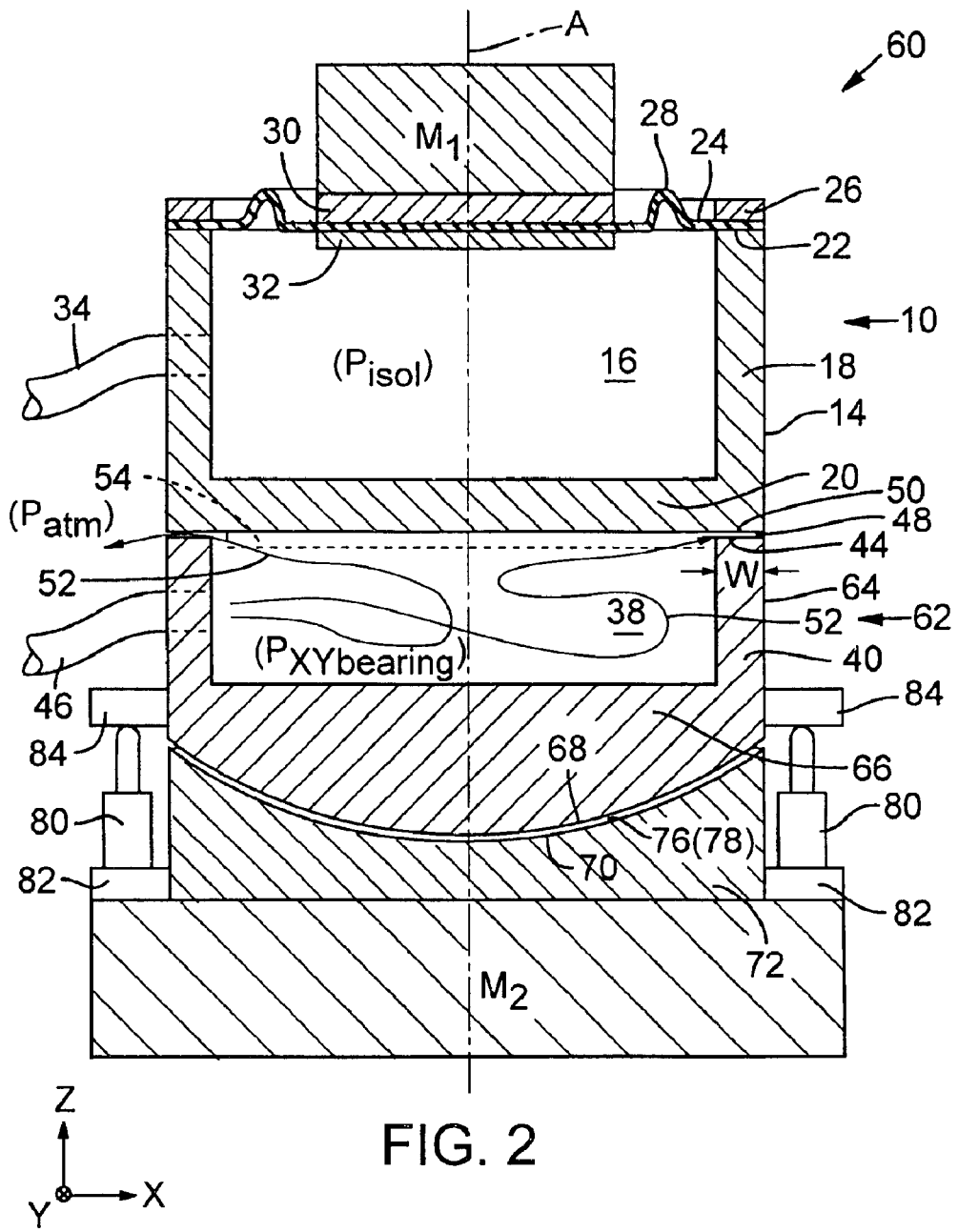
FIG. 2 is an elevational section of a vibration-attenuation device according to a second representative embodiment.

A vibration-attenuation device 60 according to this embodiment is shown in FIG. 2, in which components that are identical to corresponding components shown in FIG. 1 have the same respective reference numerals. The vibration-attenuation device 60 is situated between and contacts a first mass $M_1$ and a second mass $M_2$. The vibration-attenuation device 60 comprises a fluid-isolator portion 10 and a lateral-fluid-bearing portion 62 that desirably are aligned with each other along a support axis A.

The fluid-isolator portion 10 is configured as described above in the first representative embodiment, so description thereof is not repeated here.

The fluid-bearing portion 62 has certain similarities to the fluid-bearing portion 12 of the first representative embodiment. Descriptions of similar aspects and components are not repeated here. Rather, the following discussion is directed to features that are distinctive to the second representative embodiment.

The fluid-bearing portion 62 comprises a second housing 64 defining a bearing chamber 38. The second housing 64 in the depicted configuration includes a side wall 40 and a base wall 66. As in the first representative embodiment, the second housing 64 can have a cylindrical, rectangular, or other suitable configuration (cylindrical is especially desired). The base wall 66 of the second housing 64 has a bearing surface 68 configured as a section of a sphere. Conforming to the profile of the bearing surface is a bearing surface 70 of a base member 72. The base member 72 can have a cylindrical, rectangular, or other suitable configuration (cylindrical is especially desired). An opposing surface 74 of the base, member 72 is coupled to the mass $M_2$.

In this embodiment, the respective surface areas of the bearing surfaces 68, 70 are shown larger than the surface area of the distal edge 44; however, this is not to be regarded as limiting.

Between the bearing surfaces 68, 70 is a spherical bearing space 76 defined when the bearing space is supplied with a pressurized fluid, such as air or other gas, from a suitable source (not shown). For supplying air or other gas, the source desirably is a pressure-regulated source, and can be the same source as used to supply gas to the bearing chamber 38 or a separate source. Alternatively, the fluid in the spherical bearing space 76 can be a liquid such as non-volatile low-viscosity oil.

In any event, the fluid in the spherical bearing space 76 forms a thin fluid bearing 78 that supports the combined mass of the mass $M_1$, the isolator portion 10, and the second housing 64. The fluid bearing also allows the second housing 64 (with the isolator portion 10 and mass $M_1$) to tilt with respect to the support axis A and relative to the base member 72 and mass $M_2$. This tilting ability, along with the additional fluid bearing 78, provides enhanced vibration attenuation while providing maximal degrees of freedom of motion (including roll and pitch) of the masses $M_1$, $M_2$ relative to each other.

The tilting motion described above can be passive or active. For active tilting motion, actuators 80 are employed. The number of actuators 80 desirably is three, so as to provide support in a tripod manner. However, in general, the number is one or more, depending upon conditions of use. The actuators 80 can be attached to respective extensions 82 from the base member 72, and desirably engage respective extensions 84 of the second housing 64 or analogous structures extending from the second housing 64. Each actuator 80 can operate by any of various effects such as (but not limited to) piezoelectric, electromagnetic, pneumatic, screw mechanism, or screw with wedge mechanism.

The fluid-bearing portion 62 contacts the mass $M_2$, and the fluid-isolator portion 10 contacts the mass $M_1$. Whereas the fluid-isolator portion 10 provides good attenuation in the axial direction, the fluid-bearing portion 62 complements the fluid-isolator portion 10 by eliminating lateral stiffness while additionally allowing roll, yaw, and pitch of the portions 10, 62 relative to each other.

The first housing 14, second housing 36, and base member 72 can be made 10 of any of various rigid materials, depending upon the conditions of use and other factors. For example, these components can be fabricated from any of various metals such as steel, stainless steel, or aluminum, ceramic materials, or rigid polymeric materials. These components need not be made of the same material.

Third Representative Embodiment

A disadvantage of the first and second representative embodiments is that the respective lateral fluid bearing 48 must bear the full load of the housing 14 and mass $M_1$. Supporting such a load can result in deformation of the fluid bearing, the surfaces 44, 50 defining the fluid bearing, the housings 36 and/or 14, and/or of any structure supporting the fluid bearing, which can result in loss of bearing action. The third representative embodiment solves this problem by providing a configuration in which the fluid bearing only bears the load of the housing portion situated "above" the bearing. The fluid bearing does not support the mass $M_1$.

Figure 3:
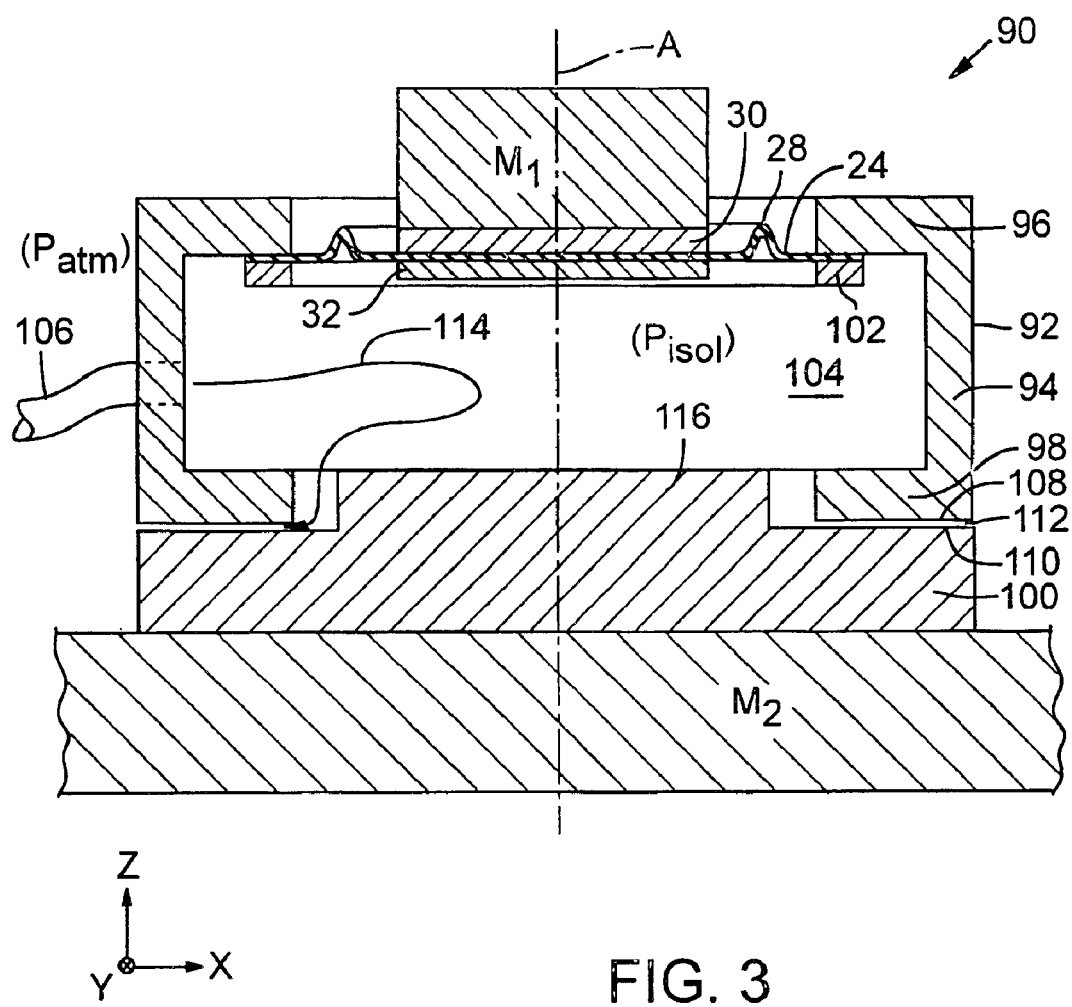
FIG. 3 is an elevational section of a vibration-attenuation device according to a third representative embodiment.

A vibration-attenuation device 90 according to this embodiment is depicted in FIG. 3, in which components that are similar to corresponding components in the first representative embodiment have the same respective reference numerals. The vibration-attenuation device 90 is situated between and contacts a first mass $M_1$ and a second mass $M_2$.

The vibration-attenuation device 90 comprises a housing 92 having a side wall 94, a first end wall 96, and a second end wall 98. The vibration-attenuation device 90 also includes a base portion 100 that desirably is axially aligned with the housing 92 (although such axial alignment is not to be regarded as limiting). A flexible diaphragm 24 extends across the opening defined by the first end wall 96 and is sealed circumferentially to the first end wall by a sealing ring 102 or the like. The sealing ring 102 can be attached to the first end wall 96 using screws or other suitable fasteners. The base portion 100 can be regarded as a portion of the housing 92 because these members (along with the diaphragm 24) define an "isolator chamber" 104. The housing 92 and base portion 100 can have a cylindrical, rectangular, or other suitable configuration (cylindrical is especially desirable).

Further detail regarding the diaphragm 24 is set forth in the first representative embodiment.

During operation the isolator chamber 104 is pressurized with a gas, such as air, at a pressure $P_{isol}$ (greater than atmospheric pressure $P_{atm}$). The gas is discharged into the isolator chamber 104 via a conduit 106 connected to a suitable source (not shown) of the gas. The source can be pressure-regulated if desired or necessary. The gas is discharged into the isolator chamber 104 sufficiently to create the desired pressure $P_{isol}$ in the isolator chamber 104. The pressure $P_{isol}$ applies a buoyant force against the diaphragm 24 sufficiently to support the combined mass of the first mass $M_1$, the mounting plates 30, 32, and the center portion of the diaphragm 24 relative to the housing 92. Thus, an axial fluid-isolator aspect of this embodiment is defined that functions in the manner of an air spring (see first representative embodiment).

The second end wall 98 includes a bearing surface 108 normally situated opposite a bearing surface 110 of the base portion 100. The pressure $P_{isol}$ is sufficiently high relative to atmospheric pressure $P_{atm}$ to cause gas to exit the isolator chamber 104 by passing between the bearing surfaces 108, 110, thereby creating a lateral fluid bearing 112 (arrow 114). It is noted that the respective surface areas of the bearing surfaces 108, 110 need not be the same, and can vary in respective size, shape, and area depending upon the particular application.

An advantage of the configuration of this embodiment is that the fluid bearing 112 supports only the mass of the housing 92, and not the first mass $M_1$. This feature can be advantageous whenever the mass $M_1$ is large. Also, the fluid bearing 112 confers substantially zero lateral stiffness to the vibration-attenuation device 90.

The base portion 100 can include a position stop 116 configured so as to prevent excessive lateral motion of the housing 92 (with mass $M_1$) relative to the base portion 100. The position stop 116 can have any practical configuration suitable for its intended purpose. In addition, a suitable stop can be provided to prevent excessive collapse of the mass $M_1$ toward the base portion 100 in the event of insufficient pressure $P_{isol}$ in the isolator chamber 104. In this regard, for example, the base portion 100 can be provided with an extension (not shown) extending upward along the axis A in FIG. 3 and having a distal end situated "beneath" the second mounting plate 32 sufficiently to stop excessive "downward" motion of the mass $M_1$ and mounting plates 30, 32. Such a stop also would prevent excess stress on the flexible diaphragm 24 in the event of insufficient pressure $P_{isol}$.

The housing 92 and base portion 100 can be made of any various rigid materials, depending upon the conditions of use and other factors, as noted above in the first representative embodiment.

Fourth Representative Embodiment

Figure 4:
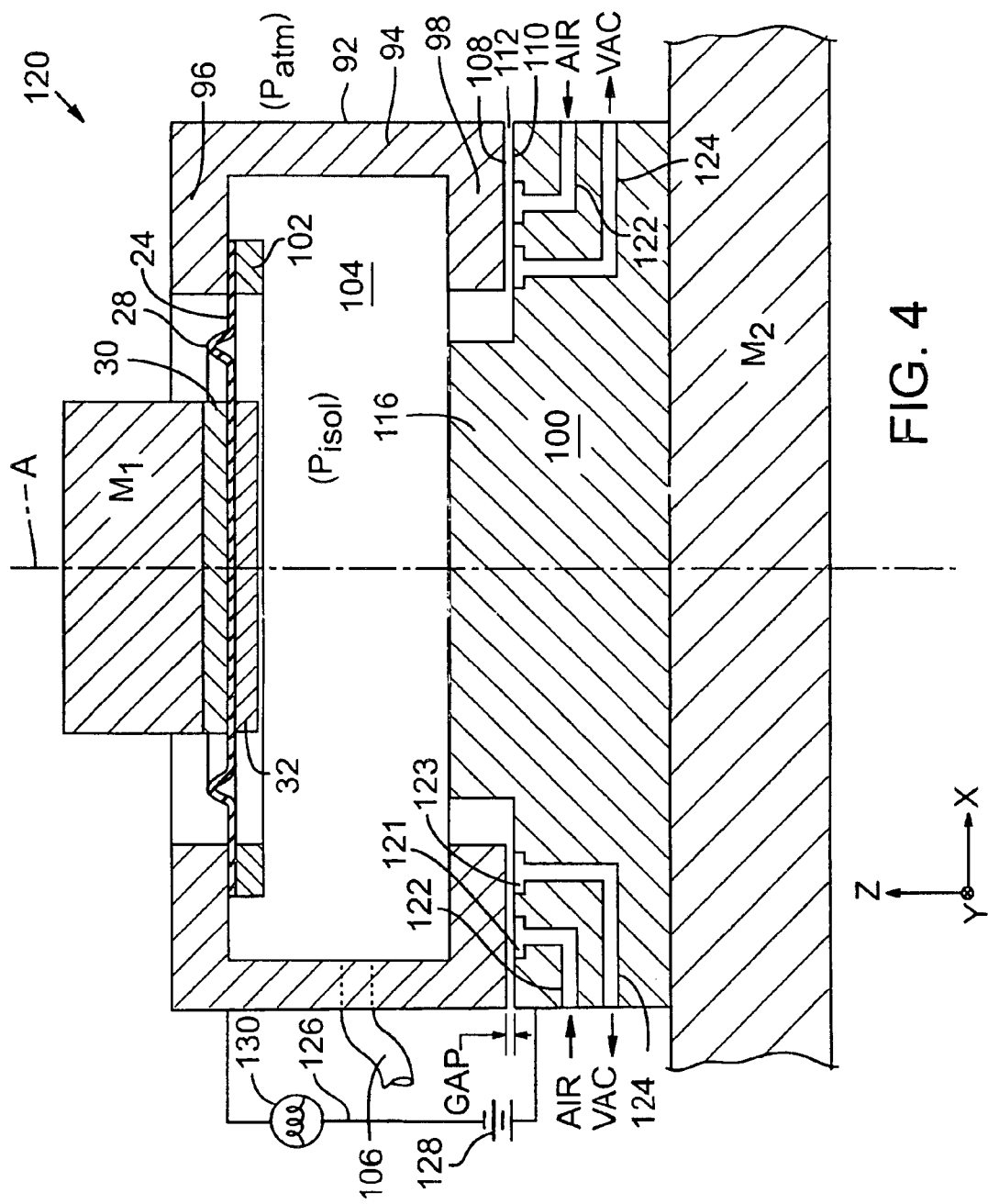
FIG. 4 is an elevational section of a vibration-attenuation device according to a fourth representative embodiment.

A vibration-attenuation device 120 according to this embodiment is shown in FIG. 4, in which components that are similar to corresponding components of the embodiment shown in FIG. 3 have the same respective reference numerals and are not described further.

The embodiment of FIG. 4 is the same as that of FIG. 3, except that the embodiment of FIG. 4 is additionally capable of making the gap of the lateral fluid bearing 112 less sensitive to $P_{isol}$ (or at least making the gap adjustable) and of detecting actual contact of the bearing surfaces 108, 110 with each other. The embodiment of FIG. 4 also allows the gap to be adjusted independently of $P_{isol}$, thereby rendering the bearing less sensitive to changes in $P_{isol}$. Hence, the bearing stability of the embodiment of FIG. 4 is improved relative to the embodiment of FIG. 3.

With respect to making the gap of the fluid bearing 112 adjustable, the base portion 100 is provided with conduits 122, 124 for air (or other suitable gas) and vacuum, respectively. The conduits 122, 124 are configured to direct fluid (gas) into the gap of the fluid bearing 112 and to aspirate fluid from the gap, respectively. Preferably, the conduits open into respective channels 121, 123 defined in the bearing surface 110 and extending circumferentially around the bearing surface 110 (see, e.g., the embodiment shown in FIG. 7). During operation, the gas pressure and the vacuum are adjusted relative to each other to achieve a desired gap in the fluid bearing 112 under the particular load conditions of the vibration-attenuation device 120. A third conduit and respective channel (not shown, but see the embodiment shown in FIGS. 6 and 7) can be provided for supplying atmospheric pressure to the respective channel.

FIG. 4 also depicts an electrical circuit 126 between the base portion 100 and the housing 92. (To such end, the base portion 100 and housing 92 are either made of an electrically conductive material such as a metal, or have applied thereto an electrically conductive coating.) The electrical circuit includes a voltage source 128 and electric indicator (e.g., lamp or other visual indicator, or audio indicator) 130 connected together in series. During operation, if the housing 92 should make physical contact with the base portion 100 (due either to the gap dwindling to zero or to the housing 92 contacting the position stop 116, for example, in the manner of closing an electrical switch), then the electrical circuit 126 is completed and the indicator 130 is actuated.

The housing 92 and base portion 100 can be made of any various rigid materials, depending upon the conditions of use and other factors, as noted above in the first representative embodiment.

Fifth Representative Embodiment

Figure 5:
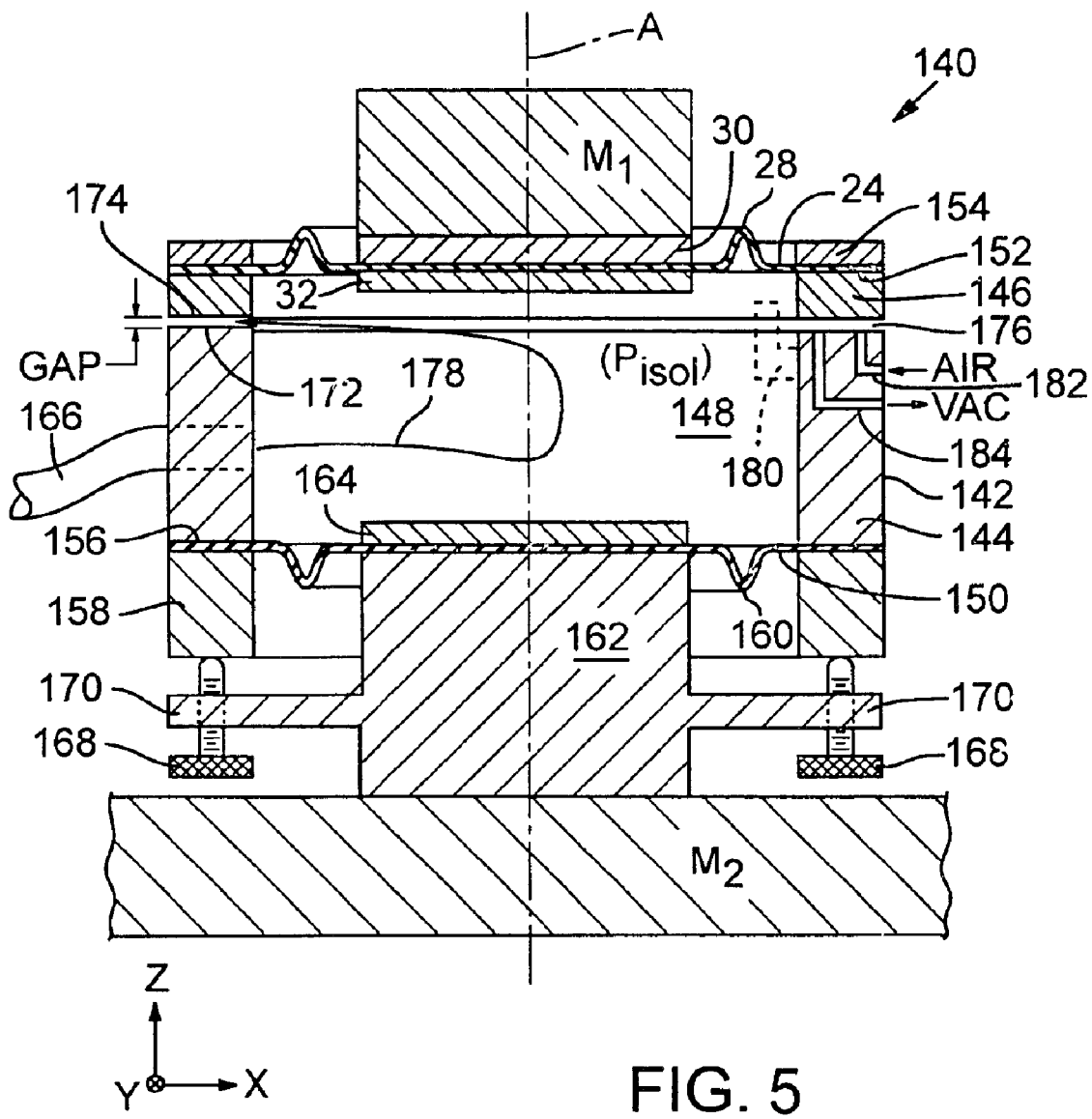
FIG. 5 is an elevational section of a vibration-attenuation device according to a fifth representative embodiment.

A vibration-attenuation device 140 according to this embodiment is shown in FIG. 5, in which components that are identical to corresponding components shown in FIG. 1 have the same respective reference numerals. The vibration-attenuation device 140 is situated between and contacts a first mass $M_1$ and a second mass $M_2$. As in the third and fourth representative embodiments, both the fluid-isolator and the lateral-fluid-bearing functions are combined.

The device 140 comprises a main housing portion 142 (defined by a side wall 144) and an "upper" housing portion 146 that collectively define a chamber 148. The housing portions 142, 146 desirably are axially aligned as shown, and desirably are cylindrical in profile with equal respective inside diameters and equal respective outside diameters. The chamber 148 is bounded above and below by respective flexible diaphragms 24, 150 extending across the respective open ends of the housing portions 142, 146. The diaphragm 24 is in circumferential sealing engagement with an edge 152 of the upper housing portion 146 using a sealing ring 154. Similarly, the diaphragm 150 is in circumferential sealing engagement with an edge 156 of the main housing portion 142 using a sealing ring 158. The sealing rings 154, 158 can be attached to the respective edges 152, 156 using screws or other suitable fasteners.

The diaphragms 24, 150 are as described in the first representative embodiment, and each includes a respective rolling seal 28, 160 or analogous feature desirably oriented as shown. The first mass $M_1$ is situated adjacent the obverse surface of the diaphragm 24, desirably in a coaxial manner. To such end, the center portion of the diaphragm 24 is sandwiched between first and second mounting plates 30, 32, respectively, wherein the first mass $M_1$ contacts the first mounting plate 30. Thus, the first mass $M_1$ and the mounting plates 30, 32 collectively function in the manner of a piston relative to the chamber 148, but have more freedom of motion (e.g., tilt relative to the support axis A) than a conventional piston. The diaphragm 150 is mounted to a base support 162 using a mounting plate 164.

During operation the chamber 148 is pressurized with a gas, such as air, at a pressure $P_{isol}$ (greater than atmospheric pressure $P_{atm}$). The gas is discharged into the chamber 148 via a conduit 166 connected to a suitable source (not shown) of the fluid. The source can be pressure-regulated if desired or necessary. The gas is discharged into the chamber 148 sufficiently to create the desired pressure $P_{isol}$ in the chamber 148. The pressure $P_{isol}$ applies a buoyant force to all surfaces in the chamber 148 sufficiently for the diaphragm 24 to support the combined mass of the first mass $M_1$, the mounting plates 30, 32, and the center portion of the diaphragm 24 relative to the base support 162. Thus, an axial fluid-isolator aspect of this embodiment is defined that functions in the manner of an air spring (see first representative embodiment).

The axial position and tilt of the sealing ring 158 (with main housing portion 142 and upper housing portion 146) relative to the base support 162 is adjustable using screw actuators 168. Desirably, three actuators are arranged circumferentially relative to the base support 162 on a flange 170 or analogous structure to support the sealing ring 158 in a tripod manner relative to the base support 162. As an alternative to the screw actuators 168, any of various other actuators can be used such as piezoelectric, electromagnetic, pneumatic, or wedge actuators, for example. Electrically powered actuators can be connected to a position-controller (not shown) that senses the positional attitude of the vibration-attenuation device 140 and adjusts the actuators accordingly. The diaphragm 150 better enables this embodiment to accommodate tilting (pitch and roll) of the main housing portion 142 (with upper housing portion 146 and sealing ring 158) relative to the base support 162. Additionally, the diaphragm 150 isolates or decouples the side wall 144 and bearing surface 172 from deflections in the base support 162. Hence, distortions in the base support 162 from reactive forces with the mass $M_2$ do not cause distortions in the side wall 144 and bearing surface 172.

As shown in FIG. 5, the main housing portion 142 includes a bearing surface 172 that normally is situated opposite a bearing surface 174 of the upper housing portion 146. The pressure $P_{isol}$ is sufficiently high relative to atmospheric pressure $P_{atm}$ to cause gas to exit the chamber 148 by passing between the bearing surfaces 172, 174, thereby creating a lateral fluid bearing 176 (note arrow 178). It is noted that the respective surface areas of the bearing surfaces 172, 174 need not be equal, and can vary in respective size, shape, and area depending upon the particular application. The extent of lateral motion of the upper housing portion 146 relative to the main housing portion 142 can be limited by a stop 180.

The fluid bearing 176 has a defined "gap." For adjusting the gap, the main housing portion 142 and/or the upper housing portion 146 is provided with conduits 182, 184 for air (or other suitable gas) and vacuum, respectively. The conduits 182, 184 are configured to direct gas to and from the gap of the fluid bearing 176 to create the desired pressure in the gap, respectively. The conduit 182 desirably is connected to a pressure-regulated source (not shown) of gas, and the conduit 184 desirably is connected to a vacuum regulated source (not shown). Preferably, the conduits 182, 184 open into respective channels (not detailed, but see FIG. 4) in the bearing surface 172 extending circumferentially around the bearing surface 172 (and/or open into respective channels in the bearing surface 174 extending circumferentially around the bearing surface 174). During operation, the vacuum and gas pressure are adjusted relative to each other to achieve a desired gap in the fluid bearing 176 under the particular load conditions of the vibration-attenuation device 140. Thus, the gap is less sensitive to changes in the pressure $P_{isol}$ in the chamber 148, the gap can be adjusted independently of $P_{isol}$, and bearing stability is improved.

A suitable stop can be provided to prevent excessive collapse of the mass $M_1$ toward the base support 162 in the event of insufficient pressure $P_{isol}$ in the chamber 148. In this regard, for example, the base support 162 can be provided with an extension (not shown) extending upward along the axis A in FIG. 5 and having a distal end situated "beneath" the second mounting plate 32 sufficiently to stop excessive "downward" motion of the mass $M_1$ and mounting plates 30, 32. Such a stop also would prevent excess stress on the flexible diaphragm 24 in the event of insufficient pressure $P_{isol}$.

The main housing portion 142, upper housing portion 146, sealing ring 158, and base support 162 can be made of any various rigid materials, depending upon the conditions of use and other factors, as noted above in the first representative embodiment.

Sixth Representative Embodiment

Figure 6:
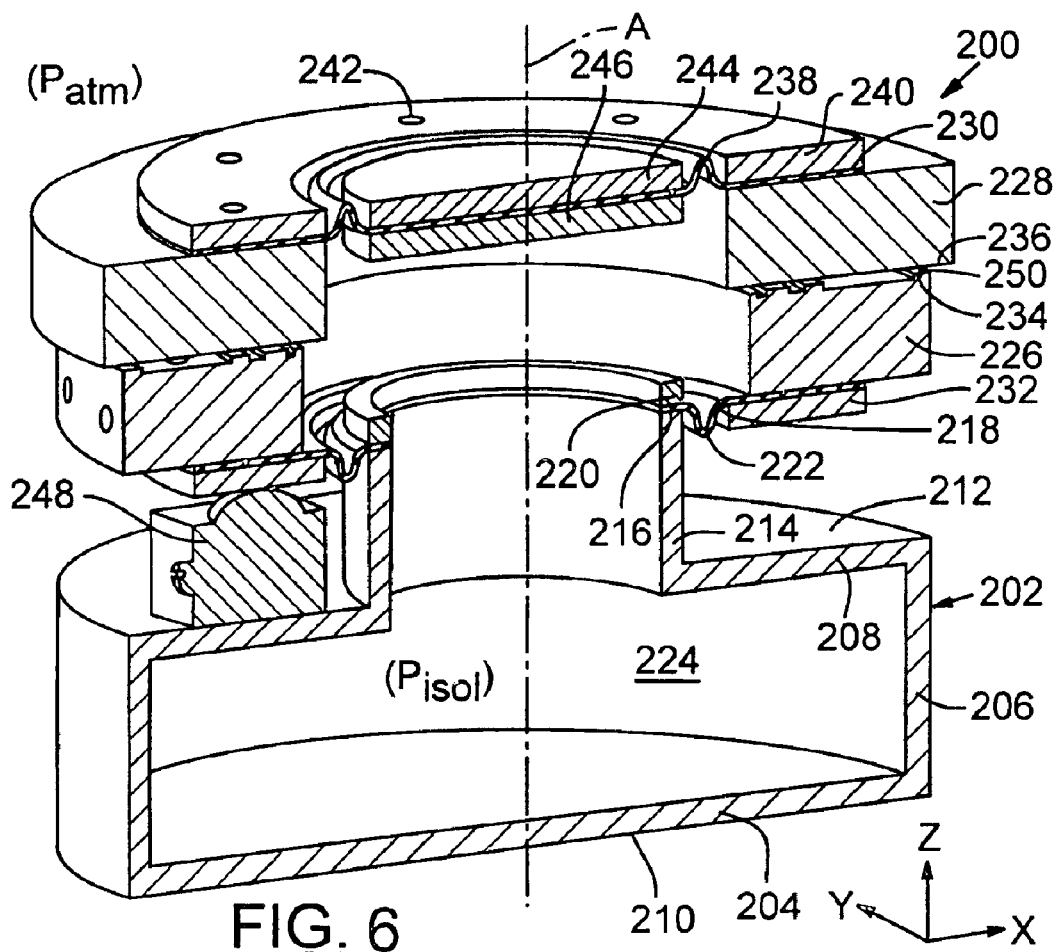
FIG. 6 is an oblique elevational section of a vibration-attenuation device according to a sixth representative embodiment.

A vibration-attenuation device 200 according to this embodiment is depicted in FIG. 6. This embodiment has certain similarities to the fifth representative embodiment in that both embodiments utilize two flexible diaphragms, have leveling capability, and combine the fluid-isolator function with the lateral-fluid-bearing function in a contiguous manner using only one chamber. Hence, this embodiment can be termed an "integrated XY bearing/Z isolator."

The device 200 includes a main housing portion 202 having a base wall 204, a side wall 206, and a "top" wall 208. The base wall 204 includes a base surface 210 that normally contacts or is coupled to a mass $M_2$ (not shown, but see FIG. 5, for example). The side wall 206 desirably is cylindrical in configuration, but alternatively can be any of various other configurations as discussed elsewhere herein. The top wall 208 includes a "top" surface 212. The top wall 208 includes an "upward"-extending neck portion 214 that desirably is cylindrical in profile. The neck portion 214 has a "top" edge 216 that desirably is circular in profile. As depicted in FIG. 6, the side wall 206 has a larger diameter than the neck portion 214. Such a configuration provides an isolator chamber 224 with a large volume, which reduces axial stiffness of the device 200.

An inside circular edge of a first, or "lower," flexible diaphragm 218 is mounted circumferentially to the top edge 216 using a sealing ring 220 or other suitable fastening means. The sealing ring 220 can be attached to the top edge 216 using screws or other suitable fasteners. The lower diaphragm 218 desirably is made of a flexible polymeric material, as described in the first representative embodiment, and includes a rolling seal 222 oriented as shown.

The main housing portion 202, together with other components, defines an isolator chamber 224. Other components that help to define the isolator chamber 224 are a first bearing ring 226, a second bearing ring 228, and a second ("upper") diaphragm 230. The periphery of the lower diaphragm 218 is mounted circumferentially to the first bearing ring 226 using a sealing ring 232 or other suitable fastening means. The sealing ring 232 can be attached to the first bearing ring 226 using screws or other suitable fasteners. The first bearing ring 226 has a bearing surface 234 that is situated opposite (in the axial direction) a corresponding bearing surface 236 of the second bearing ring 228. These bearing rings and bearing surfaces are described in more detail below.

The second diaphragm 230 desirably is made of a flexible polymeric material, as described in the first representative embodiment, and includes a rolling seal 238 oriented as shown. The periphery of the second diaphragm 230 is mounted circumferentially to the second bearing ring 228 using a sealing ring 240. The sealing ring 240 can be attached to the second bearing ring 228 using screws 242 or other suitable fasteners. The center portion of the upper diaphragm 230 is sandwiched between first and second mounting plates 244, 246, respectively, wherein the first mass $M_1$ (not shown, but see FIG. 5) contacts the first mounting plate 244.

Between the top surface 212 of the main housing portion 202 and the sealing ring 232 are multiple tilt actuators 248. Desirably, three tilt actuators are used so as to provide support in a tripod manner. Each tilt actuator 248 can be as described in the second representative embodiment. Although the tilt actuators 248 as depicted in FIG. 6 are situated on the top surface 212, this configuration is not intended to be limiting. As an alternative to the depicted configuration, the tilt actuators 248 can be mounted in a manner as shown, for example, in FIG. 2. Control circuitry for actuating the tilt actuators 248 can be integrated with circuitry provided elsewhere in the machine in which the devices 200 are used. For example, control of the actuators 248 can involve positional detection of another portion of a machine incorporating the devices 200, with the tilt actuators 248 being actuated in a selective manner to correct a positional shift or to provide a particular positional configuration of that portion of the machine.

During operation the isolator chamber 224 is pressurized with a gas, such as air, at a pressure $P_{isol}$. The gas is discharged into the isolator chamber 224 via a conduit (not shown, but see FIG. 5) connected to a suitable regulated source (not shown) of the gas. The gas is discharged into the isolator chamber 224 sufficiently to create the pressure $P_{isol}$, thereby providing the fluid-isolator function of the device 200. Such a fluid isolator exhibits low axial stiffness due in part to the relatively large volume of the isolator chamber 224 and in part to the axial flexibility of the upper diaphragm 230.

Desirably, the device 200 is configured such that $P_{isol}$ changes with changes in load (especially along the support axis A). In this regard, the device 200 desirably is provided with a means to sense pressure in the isolator chamber 224, and the source of the gas desirably is pressure regulated. Also, a flow monitor (not shown, but well understood in the art) can be connected between the regulated source and the isolator chamber 224 to monitor gas flow from the isolator chamber 224 across a lateral fluid bearing 250 between the bearing surfaces 234, 236. If the entering gas flow exceeds a certain pre-set threshold, then an alarm or other indication can be triggered (or a feedback system activated) to reduce $P_{isol}$ as required. Also, the gap in the lateral fluid bearing 250 can be monitored if desired, wherein if the gap exceeds a pre-set threshold, then an alarm can be triggered (or a feedback system activated) to correct the gap.

The lateral fluid bearing 250 enables the device 200 to provide lateral movement of the masses $M_1$, $M_2$ relative to each other over a limited range with essentially no friction. Hence, lateral vibration between the masses $M_1$, $M_2$ is suppressed. The fluid bearing 250 also prevents coupling of lateral and rotational motions of the masses $M_1$, $M_2$, allowing better control of the mass $M_1$ relative to the mass $M_2$.

Desirably, one of the bearing surfaces 234, 236 has respective channels defined therein to provide vacuum, pressurized gas, and the like to the lateral fluid bearing 250. As noted above in the fourth representative embodiment, application of localized pressure and vacuum to the fluid bearing allows the gap of the fluid bearing 250 to be adjusted independently of $P_{isol}$. Also, the gap is less sensitive to changes in $P_{isol}$, and bearing stability is improved.

Figure 7:
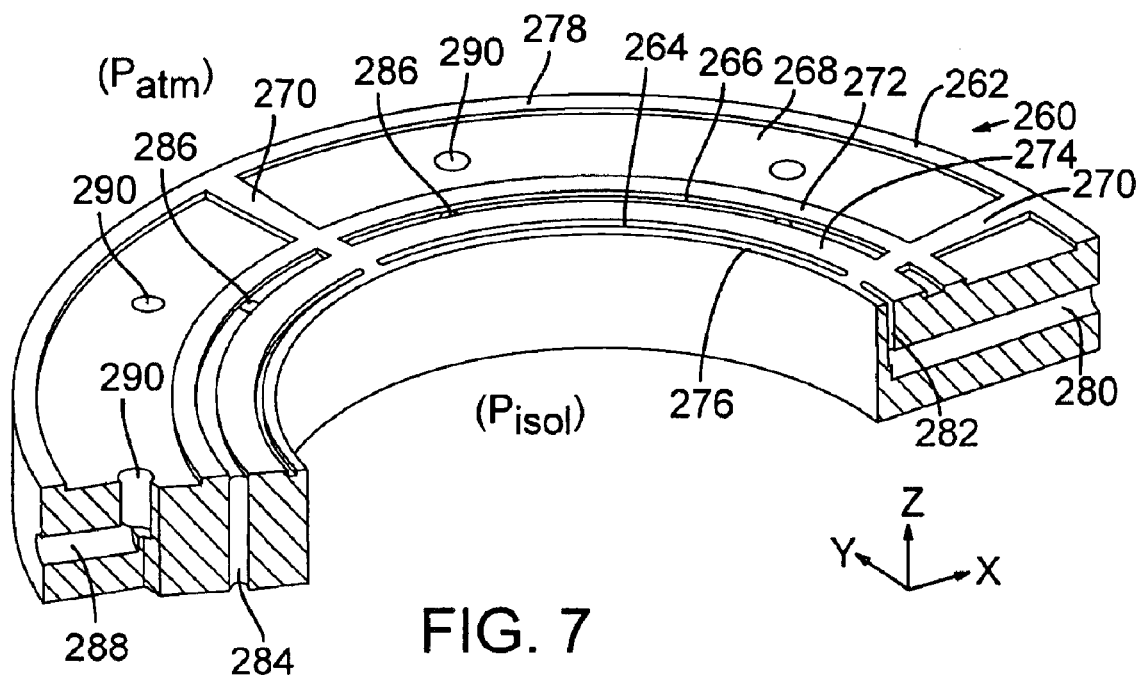
FIG. 7 is an oblique elevational section of a bearing ring in the embodiment of FIG. 6.

An exemplary bearing ring 260 is shown in FIG. 7. The bearing ring 260 (which can be either of the bearing rings 226, 228) includes a bearing surface 262. In this configuration, the bearing surface 262 defines three concentric channels: an inner channel 264, a middle channel 266, and an outer channel 268. The channels can be segmented by radial ribs 270 or the like, and are separated from each other by intervening circular ribs 272, 274. Also present are an inner rib 276 and an outer rib 278. The ribs 270, 272, 274, 276, 278 are all coplanar with the bearing surface 262. Desirably, the radial ribs 270 separate respective segments of the inner and outer channels 264, 268, respectively, from each other, thereby facilitating pitch and roll stability of the bearing. The middle channel 266 can be divided into segments by the radial ribs 270 or can be continuous. The number of radial ribs can be sufficient to divide the bearing into, for example, two, three, four, or more "pads." Each such "pad" represents a respective radial segment of the bearing.

During operation the inner channel 264 desirably is pressurized with a suitable gas at a pressure $P_{XYbearing} \approx P_{isol}$ through a respective conduit 280 that opens into the inner channel 264 via an orifice 282. (The conduit 280 desirably opens into the inner channel via a precision orifice.) The middle channel 266 desirably is pressurized at about $P_{atm}$ through a respective conduit 284 that opens into the middle channel via an orifice 286. The outer channel 268 desirably is evacuated to a suitable vacuum $P_{vac}$ through a respective conduit 288 that opens into the outer channel via an orifice 290. The ribs 272, 274, 276, 278 serve to minimize leakage flow from $P_{isol}$ to $P_{atm}$. Also, the pressure gradient from the inner channel 264 to the middle channel 266 yields a small "upward" force against the bearing surface 236. The subatmospheric pressure $P_{vac}$ in the outer channel tends to counter this upward force.

As can be seen, each channel can be served by multiple respective conduits and orifices so as to maintain an equal pressure or vacuum condition throughout the respective channel. The radial width as well as depth of each channel 264, 266, 268 can be varied as required for specific bearing conditions. In general, the channels 264, 266, 268 and their respective pressures eliminate crosstalk between the lateral fluid bearing 250 and the isolator chamber 224 that otherwise can cause instability of the fluid bearing 250. Also, if $P_{XYbearing} \approx P_{isol}$, substantially no gas flow occurs between the chamber 224 and the channel 264, which eliminates crosstalk between the isolator chamber 224 and the inner channel 264.

The bearing rings 226, 228 in FIG. 6 (as exemplified by the bearing ring 260 shown in FIG. 7) can be made of any suitable rigid material that is hard and resistant to wear, such as ceramic. Alternatively, the bearing rings can be made of hardened steel, stainless steel, or of another suitable metal. Further alternatively, the bearing rings can be made of a rigid material layered with a ceramic or other suitable bearing material on the bearing surfaces such that the channels are defined in the bearing material. By way of example, the bearing rings 226, 228 can be made of stainless steel 440C having HRC 60 heat treatment, passivated, and machined to a flatness of 0.001 mm and a surface roughness of 0.2 $\mu$m.

Figure 9:
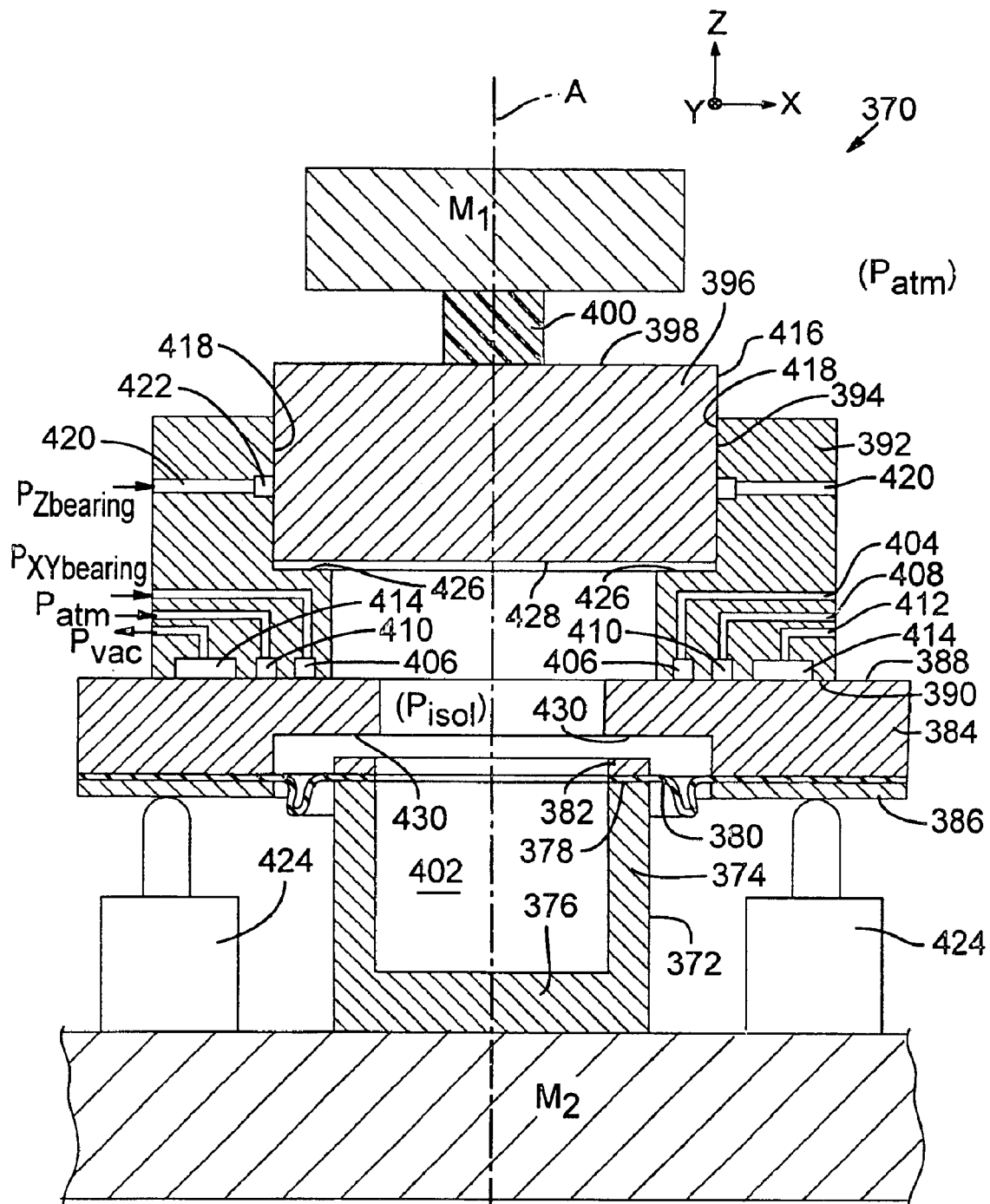
FIG. 9 is an elevational section of a vibration-attenuation device according to an eighth representative embodiment.

Although FIG. 6 depicts channels in the bearing surface 234 of the first (or "lower") bearing ring 226, the channels alternatively can be defined in the bearing surface 236 of the second (or "upper") bearing ring 228 (see, e.g., FIG. 9). This alternative configuration may be preferable for better control of certain moments. Also, although FIG. 6 depicts the second bearing ring 228 (lacking channels) as having a radially wider bearing surface 236 than the bearing surface 234 of the first bearing ring 226, it alternatively is possible to configure the first bearing ring 226 with the wider bearing surface 234 (with the channels being defined in the bearing surface 236 of the second bearing ring 228). It is desirable to configure the non-channeled bearing surface wider in the radial direction than the channeled bearing surface. Further alternatively, both bearing surfaces can be configured with identical radial widths.

Aside from the bearing rings, the main housing portion 202, sealing rings 220, 232, 240, and mounting plates 244, 246 can be made of any of various rigid materials, depending upon the conditions of use and other factors. By way of example, a suitable material is aluminum alloy.

It is noted that in this embodiment and other embodiments comprising an isolator chamber and a lateral fluid bearing of which the bearing surfaces have channels, $P_{isol}$ need not be at atmospheric pressure or greater. To accommodate certain applications, $P_{isol}$ may be at a subatmospheric pressure, in which instance the respective locations of the pressure channels and vacuum channels in the bearing surfaces simply are reversed from the order shown in FIG. 6.

Seventh Representative Embodiment

Figure 8:
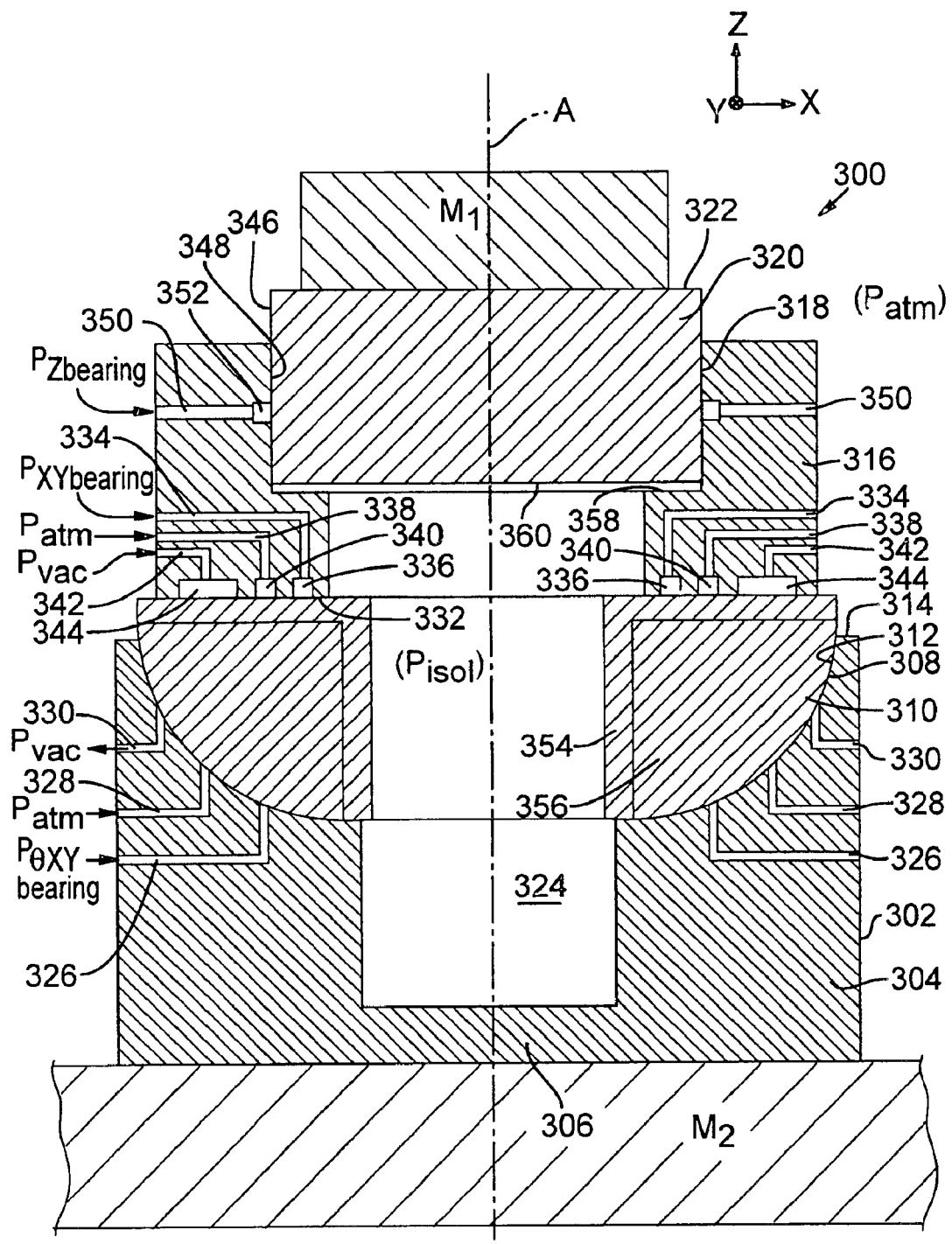
FIG. 8 is an elevational section of a vibration-attenuation device according to a seventh representative embodiment.

A vibration-attenuation device 300 according to this embodiment is depicted in FIG. 8. This embodiment combines an axial fluid-isolator with a lateral (XY-direction) substantially zero-stiffness fluid bearing ("XY bearing"), an axial (Z-direction) fluid bearing ("Z bearing"), and a spherical fluid bearing ("$\theta_{XY}$ bearing") between the XY bearing and the mass $M_2$. The $\theta_{XY}$ bearing can eliminate any need for tilt adjustment and prevents binding of the Z bearing. In the device 300 (as well as in the devices of the eighth through eleventh representative embodiments described below), in contrast to the first through sixth representative embodiments, the flexible diaphragm of the fluid isolator is replaced with an axially oriented fluid bearing ("Z bearing"). By eliminating the flexible diaphragm of the fluid isolator, the capability of the devices of isolating high-frequency vibrations between the masses $M_1$, $M_2$ is improved for certain applications.

The device 300 comprises a main housing portion 302 having a stout side wall 304 and a base wall 306. During use the base wall 306 contacts or is coupled to the mass $M_2$. The side wall 304 defines a concave spherical-bearing surface 308. A second housing portion 310 defines a convex spherical surface 312 that conforms to and thus fits in the concavity defined by the bearing surface 308. The second housing portion 310 includes a planar bearing surface 314 on which rests a lateral-fluid-bearing unit 316 (also regarded as a third housing portion). The lateral-fluid-bearing unit 316 defines an opening 318 into which is inserted, in a slidable manner, a piston 320. The piston 320 includes an "upper" surface 322 that contacts or is coupled to the mass $M_1$ during use. Hence, the mass $M_1$ is regarded as the "isolated" mass.

The main housing portion 302, lateral-fluid-bearing unit 316, and piston 320 desirably have respective cylindrical profiles. In such a configuration, the second housing portion 310 has a circular profile when viewed from the support axis A. The piston 320, main housing portion 302, lateral-fluid-bearing unit 316, and second housing portion 310 collectively define an isolator chamber 324. The isolator chamber 324 is pressurized with a suitable gas (e.g., air) to a pressure $P_{isol}$ via a conduit (not shown, but see FIG. 5) connected to a pressurized source of the gas.

If desired, especially to increase the volume of the isolator chamber 324, the main housing portion 302 can have a "lower" portion (closer to the mass $M_2$) having an increased diameter in a manner similar to the housing 202 of the embodiment of FIG. 6.

Between the spherical surfaces 308, 312 is a spherical fluid bearing allowing the second housing portion 310 to tilt and roll relative to the main housing portion 302 and/or to the support axis A. The spherical bearing is served by a conduit 326 that pressurizes a respective channel (not shown, but see FIG. 7) defined in the bearing surface 308 with gas at a pressure $P_{\theta xybearing} \approx P_{isol}$. Note that the conduit 326 opens at a location on the bearing surface 308 that is closest to the isolator chamber 324. The spherical bearing also is served by a conduit 328 that establishes a gas pressure of $P_{atm}$ in a respective channel (not shown, but see FIG. 7) defined in the bearing surface 308, and by a conduit 330 that evacuates a respective channel (not shown, but see FIG. 7) defined in the surface to a vacuum $P_{vac}$. Note that the conduit 328 opens at a location on the bearing surface 308 that is between the respective locations at which the conduits 326 and 330 open.

The lateral-fluid-bearing unit 316 includes a "bottom" planar surface 332 situated opposite the bearing surface 314. Between the surfaces 314, 322 is a lateral fluid bearing allowing the units 310, 316 to move laterally (XY-direction) relative to each other, with substantially zero lateral stiffness. The lateral fluid bearing is served by a conduit 334 that pressurizes a respective channel 336 defined in the surface 332 at a gas pressure $P_{XYbearing} \approx P_{isol}$. Note that the channel 336 is at a location on the surface 332 that is closest to the isolator chamber 324. The lateral fluid bearing also is served by a conduit 338 that establishes a pressure $P_{atm}$ in a respective channel 340 defined in the surface 332, and by a conduit 342 that evacuates a respective channel 344 defined in the surface 332 to a vacuum $P_{vac}$. Note that the channel 340 is situated between the channels 336, 344.

The piston 320 (desirably cylindrical in configuration) includes a side surface 346 on which the piston 320 slides generally in the axial direction in the opening 318. Thus, the side surface 346 is situated opposite a respective surface 348 of the lateral-fluid-bearing unit 316. Between the surfaces 346, 348 is an axial fluid bearing allowing the piston 320 and lateral-fluid-bearing unit 316 to move axially relative to each other, with substantially zero axial stiffness. This axial fluid bearing is served by a conduit 350 that pressurizes a respective channel 352 with gas (e.g., air) at a pressure $P_{Zbearing} \approx P_{isol}$.

Note that the lateral-fluid-bearing unit 316 defines a shoulder 358 limiting the "downward" axial movement range of the piston 320 relative to the lateral-fluid-bearing unit 316. I.e., whenever the piston 320 is inserted maximally into the opening 318, the "lower" surface 360 of the piston 320 rests on the shoulder 358. The "upward" limit of movement of the piston 320 relative to the lateral-fluid-bearing unit 316 can be established by, for example, installing a mechanical stop (not shown) on the lateral-fluid-bearing unit 316 that engages the "upper" ("top") surface 322 of the piston 320. Similarly, a mechanical stop (not shown) can be mounted to the second housing portion 310 to limit the extent of lateral motion of the lateral-fluid-bearing unit 316 relative to the spherical bearing unit.

The main housing portion 302, second housing portion 310, lateral-fluid-bearing unit 316 (third housing portion), and piston 320 can be made of any of various rigid materials, depending upon the conditions of use and other factors. By way of example, candidate materials include steel, stainless steel, aluminum alloy, or ceramic. Further by way of example, these components can be made of a suitable metal or other rigid material, wherein the respective bearing surfaces are defined on a layer of ceramic or other suitable bearing material. An example of this latter configuration is shown in FIG. 8, depicting a layer of ceramic 354 (for the lateral fluid bearing) over a metal core 356.

Eighth Representative Embodiment

A vibration-attenuation device 370 according to this embodiment is depicted in FIG. 9. This embodiment combines a fluid-isolator with a lateral (XY-direction) substantially zero-stiffness fluid bearing ("XY bearing"), an axial (Z-direction) fluid bearing ("Z bearing"), tilt adjusters, and a compliant member situated between the mass $M_1$ and the Z bearing. The compliant member prevents binding of the Z bearing.

The device 370 comprises a main housing portion 372 having a side wall 374 and a base wall 376. During use, the base wall 376 contacts or is coupled to the mass $M_2$. The main housing portion 372 desirably has a cylindrical profile.

The side wall 374 has a distal edge 378 to which a flexible diaphragm 380 (similar to the diaphragm 218 in FIG. 6) is mounted circumferentially using a sealing ring 382 or other suitable fastening means. The diaphragm 380 desirably is made of a flexible polymeric material, as described in the first representative embodiment. The sealing ring 382 can be attached to the edge 378 using screws or other suitable fasteners.

The periphery of the diaphragm 380 is mounted circumferentially to a first bearing ring 384 (also termed a "second housing portion") using a sealing ring 386 or other suitable fastening means. The sealing ring 386 can be attached to the first bearing ring 384 using screws or other suitable fasteners. The first bearing ring 384 has a bearing surface 388 that is situated opposite (in the axial direction) a corresponding bearing surface 390 of a second bearing ring 392 (also termed a "third housing portion"). These bearing surfaces 388, 390 are described in more detail below.

The second bearing ring 392 defines an opening 394 into which is inserted, in a slidable manner, a piston unit 396. The piston unit 396 includes a "top" surface 398 that is coupled to the mass $M_1$ via a compliant member 400. The compliant member 400 allows the mass $M_1$ to tilt and roll (over a limited range) relative to the piston unit 396 (and/or the support axis A) without the piston unit 396 binding in the opening 394. The compliant member 400 can be made of any suitable compliant material, such as an elastomeric material.

The main housing portion 372, diaphragm 380, first bearing ring 384 (second housing portion), second bearing ring 392 (third housing portion), and piston unit 396 desirably have a cylindrical profile and collectively define an isolator chamber 402. If desired, especially to increase the volume of the isolator chamber 402, the main housing portion 372 can have a "lower" portion (closer to the mass $M_2$) having an increased diameter in a manner similar to the housing 202 of the embodiment of FIG. 6.

Between the bearing surfaces 388, 390 is a fluid bearing allowing the bearing rings 384, 392 to move laterally (XY-direction) relative to each other with substantially zero lateral stiffness. The lateral fluid bearing is served by a conduit 404 that pressurizes a respective channel 406 defined in the bearing surface 390 with gas (e.g., air) at a pressure $P_{XYbearing} \approx P_{isol}$. Note that the channel 406 is at a location on the bearing surface 390 that is closest to the isolator chamber 402. The lateral fluid bearing also is served by a conduit 408 that establishes a pressure $P_{atm}$ in a respective channel 410 defined in the bearing surface 390, and by a conduit 412 that evacuates a respective channel 414 defined in the bearing surface 390 to a vacuum $P_{vac}$. Note that the channel 410 is between the channels 406, 414.

The piston unit 396 (desirably having a cylindrical configuration) includes a side surface 416 on which the piston unit 396 slides generally in the axial direction in the opening 394. Thus, the side surface 416 is situated opposite a respective surface 418 of the second bearing ring 392. Between the surfaces 416, 418 is an axial fluid bearing allowing the piston unit 396 and second bearing ring 392 to move axially relative to each other, with substantially zero axial stiffness. This axial bearing is served by a conduit 420 that pressurizes a respective channel 422 with gas at a pressure $P_{Zbearing} \approx P_{isol}$. By keeping $P_{Zbearing} \approx P_{isol}$, the flow between these two sources is approximately zero. This minimizes the impact between these sources and makes regulation more efficient.

The device of FIG. 9 also includes tilt adjusters 424 (desirably at least three) configured for adjusting the tilt (pitch and roll) of the first bearing ring 384 (and structures supported thereon) relative to the main housing portion 372. In other words, the tilt adjusters 424 can be used for adjusting the plane of the XY bearing relative to the support axis A. In a stepper machine such adjustments can serve to reduce the amount of external horizontal force (e.g., from Lorentz-force actuators) required to maintain the horizontal position of the mass $M_1$. The tilt adjusters 424 can be any of various actuators such as the actuators 80 shown in FIG. 2, and desirably are active (e.g., piezoelectric, electromagnetic, pneumatic, or the like) rather than passive (e.g., screw, wedge, or analogous means).

As a result of the pressure $P_{isol}$ in the isolator chamber 402, which supports the mass $M_1$ in the axial direction, the required magnitude of force exerted by the tilt adjusters 424 for achieving a desired leveling is small. Also, the flexible diaphragm 380 renders the isolator chamber 402 sufficiently compliant to allow tilt adjustment. I.e., the compliance of the isolator chamber 402 allows the chamber to "deform" sufficiently to accommodate a desired tilt without deforming any bearing surfaces.

The compliant member 400 prevents the Z bearing from binding under a condition in which the mass $M_1$ is constrained relative to the mass $M_2$ in the pitch and roll DOF (i.e., $\theta_x$, $\theta_y$) by, e.g., Lorentz-force actuators.

If desired, the main housing portion 372 can be enlarged at its "bottom" end such as disclosed in FIG. 6 to provide support for the tilt adjusters 424. Doing this adds additional volume to the chamber and lowers the stiffness of the fluid isolator, while maintaining the same footprint.

Note that the second bearing ring 392 defines a shoulder 426 limiting the "downward" axial movement range of the piston unit 396 relative to the second bearing ring 392. I.e., whenever the piston unit 396 is inserted maximally into the opening 394, the "lower" surface 428 of the piston unit 396 rests on the shoulder 426. The "upward" limit of movement of the piston unit 396 relative to the second bearing ring 392 can be established by, for example, installing a mechanical stop (not shown) on the second bearing ring 392 that engages the "upper" ("top") surface 398 of the piston unit 396. Similarly, the first bearing ring 384 includes a shoulder 430 configured to engage the "top" surface of the sealing ring 382 whenever the first bearing ring 384 experiences excessive movement toward the mass $M_2$. In addition, a mechanical stop (not shown) can be mounted to the first bearing ring 384 to limit the extent of lateral motion of the second bearing ring 392 relative to the first bearing ring 384.

The main housing portion 372, bearing rings 384, 392, and piston unit 396 can be made of any of various rigid materials, depending upon the conditions of use and other factors. By way of example, a suitable material is steel, stainless steel, aluminum alloy, or ceramic. Any of these components can be made of a rigid material, with a layer of ceramic or other suitable bearing material on the respective bearing surfaces.

Ninth Representative Embodiment

Figure 10:
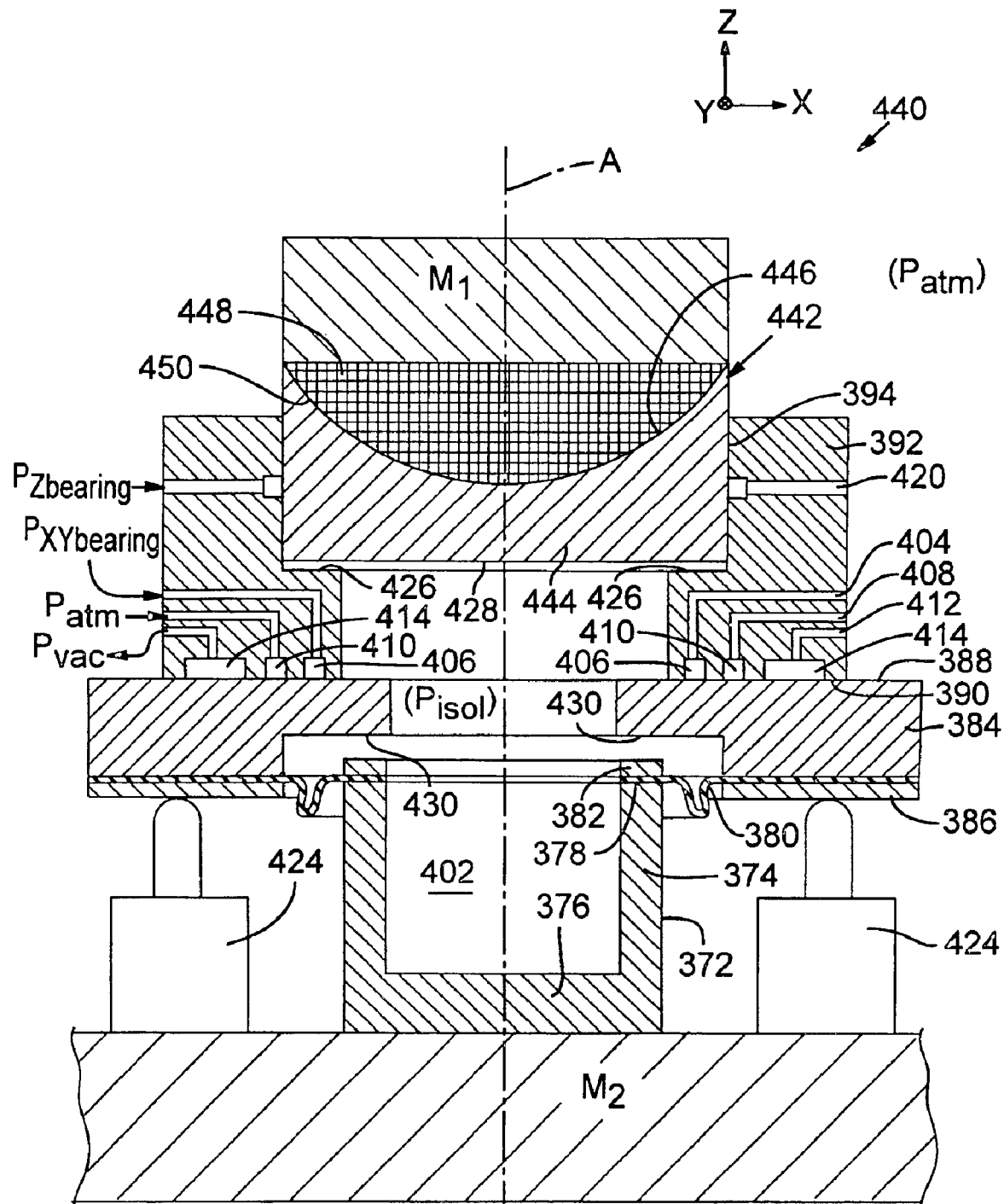
FIG. 10 is an elevational section of a vibration-attenuation device according to a ninth representative embodiment.

A vibration-attenuation device 440 according to this embodiment is depicted in FIG. 10. This embodiment shares many similarities with the embodiment of FIG. 9. Hence, components in FIG. 10 that are identical to corresponding components in FIG. 9 have the same respective reference numerals and are not described further.

The embodiment of FIG. 10 combines a fluid isolator with a lateral (XY-direction) substantially zero-stiffness fluid bearing ("XY bearing"), an axial (Z-direction) fluid bearing ("Z bearing"), tilt adjusters, and a spherical fluid bearing ("$\theta_{XY}$ bearing") between the mass $M_1$ and the Z bearing. The spherical fluid bearing has the same function as the compliant member 400 in the eighth representative embodiment.

The key distinction of the device of FIG. 10 relative to the device of FIG. 9 pertains to the configuration of the piston of the Z bearing. Namely, in FIG. 9, the piston unit 396 is a single unit, but in FIG. 10 the piston 442 comprises a first portion 444 defining a concave spherical bearing surface 446, and a second portion 448 defining a convex spherical bearing surface 450 conforming to the concave bearing surface 446. Between the bearing surfaces 446, 450 is a spherical fluid bearing ("$\theta_{XY}$ bearing") allowing the second portion 448 to tilt and roll relative to the first portion 444.

Although not detailed in FIG. 10, the first portion 444 desirably defines conduits and channels (see conduits 326, 328, 330 in FIG. 8 that open into respective channels defined in the concave bearing surface 308, as described in the seventh representative embodiment).

Tenth Representative Embodiment

A vibration-attenuation device 470 according to this embodiment is depicted in FIG. 1. This embodiment shares many similarities with the embodiment of FIG. 9. Hence, components in FIG. 11 that are identical to corresponding components in FIG. 9 have the same respective reference numerals and are not described further.

Figure 11:
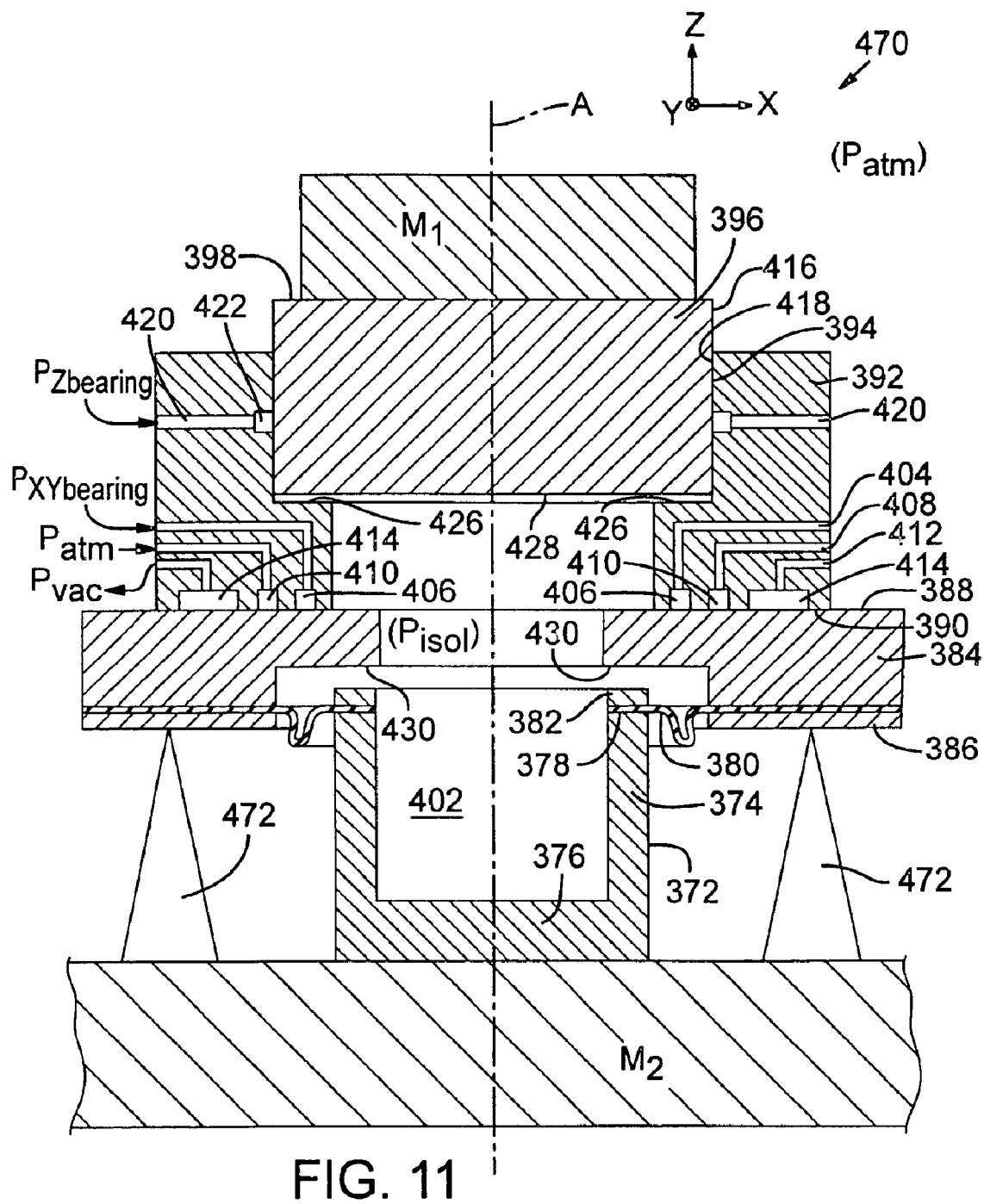
FIG. 11 is an elevational section of a vibration-attenuation device according to a tenth representative embodiment.

The embodiment of FIG. 11 combines a fluid isolator with a lateral (XY-direction) substantially zero-stiffness fluid bearing ("XY bearing"), an axial (Z-direction) fluid bearing ("Z bearing"), and compliant members contacting the second mass $M_2$.

One key distinction of the device of FIG. 11 relative to the device of FIG. 9 pertains to the absence in FIG. 11 of the compliant member 400 between the mass $M_1$ and the piston unit 396. That is, in FIG. 11, the mass $M_1$ is coupled directly to the "top" surface 398 of the piston unit 396. However, in place of the tilt adjusters 424 in FIG. 9, the device of FIG. 11 includes compliant members 472 (made, e.g., of an elastomeric material) extending between the mass $M_2$ and the first bearing ring 384. (The respective apices of the compliant members 472 contact the sealing ring 386 in the figure in a tripod manner.) The compliant members 472 have the same function as the compliant member 400 in the eighth representative embodiment, and thus allow tilt, yaw, and roll of the XY bearing relative to the support axis A. Thus, the need for tilt adjusters is eliminated because the lateral fluid bearing will follow any tilt of the mass $M_1$. Actuators constraining the mass $M_1$ in the pitch and roll DOF (i.e., $\theta_x$, $\theta_y$) would act as tilt adjusters.

Eleventh Representative Embodiment

Figure 12:
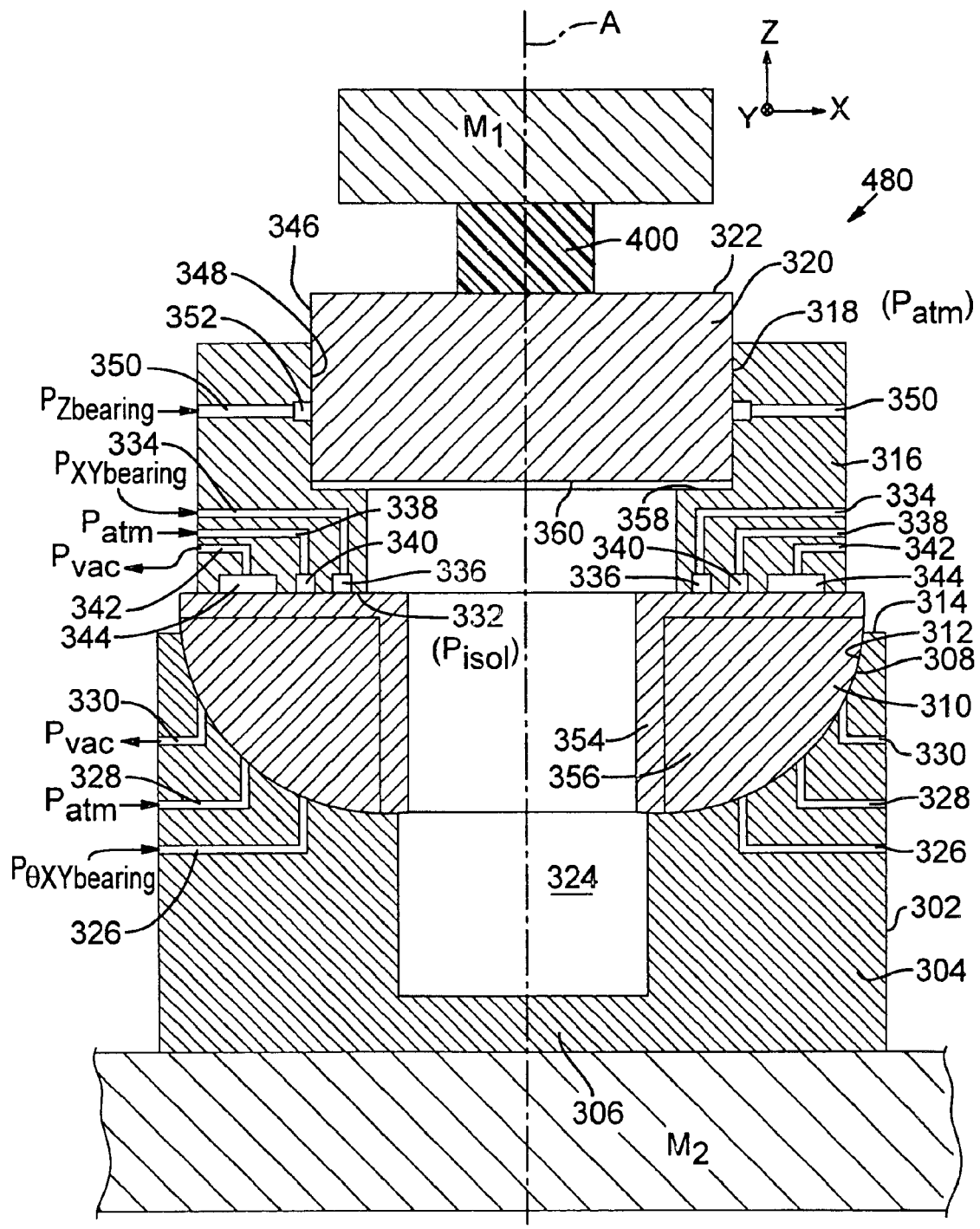
FIG. 12 is an elevational section of a vibration-attenuation device according to an eleventh representative embodiment.

A vibration-attenuation device 480 according to this embodiment is depicted in FIG. 12. This embodiment shares many similarities with the embodiment of FIG. 8. Hence, components in FIG. 12 that are identical to corresponding components in FIG. 8 have the same reference numerals and are not described further.

The embodiment of FIG. 12 combines a fluid isolator with a lateral (XY-direction) substantially zero-stiffness fluid bearing ("XY bearing"), an axial (Z-direction) fluid bearing ("Z bearing"), a spherical fluid bearing ("$\theta_{XY}$ bearing") between the XY bearing and the mass $M_2$, and a compliant member between the mass $M_1$ and the Z bearing. The $\theta_{XY}$ bearing and compliant member eliminate the need for tilt adjustment and prevent binding of the Z bearing.

The key distinction of the device of FIG. 12 relative to the device of FIG. 8 pertains to the presence of the compliant member 400 in the device of FIG. 12. The compliant member 400 is configured and positioned as described in the eighth representative embodiment. The spherical bearing and item 400 have redundant functionality in this embodiment. This redundancy adds additional pitch and roll degrees of freedom (i.e., $\theta_x$, $\theta_y$ motions). As a result, no tilt adjuster is needed.

With respect to all embodiments disclosed herein, the bearing portion may include an orifice that provides gas or other fluid to the bearing surface. For example, the orifice can be defined by a fluid-supplying conduit connected to the bearing surface.

Twelfth Representative Embodiment

Figure 17:
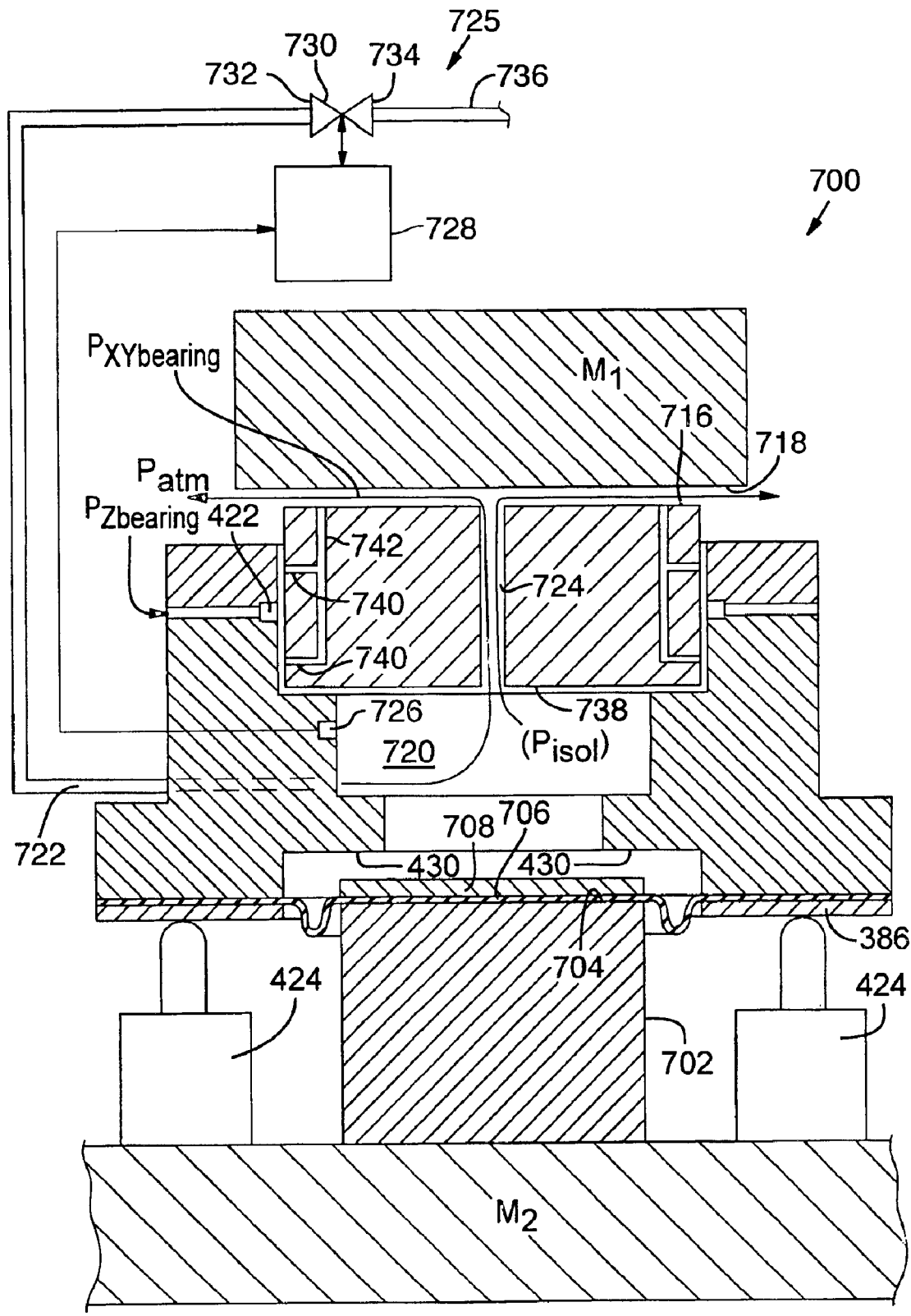
FIG. 17 is an elevational section of a vibration-attenuation device according to a twelfth representative embodiment.

A vibration-attenuation device 700 according to this embodiment is depicted in FIG. 17. This embodiment shares many similarities with the embodiment of FIG. 9. Hence, components in FIG. 17 that are identical to corresponding components in FIG. 9 have the same respective reference numerals and are not described further.

This embodiment combines a fluid-isolator with a lateral (XY-direction), substantially zero-stiffness fluid bearing ("XY bearing"), an axial (Z-direction) fluid bearing ("Z bearing"), and optional tilt adjusters. One distinction between the device 700 of FIG. 17 and the device 370 of FIG. 9 pertains to the placement of the lateral fluid bearing. In the device 370 of FIG. 9, a lateral fluid bearing is defined between adjacent surfaces of first and second bearing rings. In contrast, in the device 700 of FIG. 17, a lateral fluid bearing is defined between adjacent surfaces of a piston unit 714 and a mass $M_1$. The lateral fluid bearing of FIG. 17 is described in greater detail below.

As shown in FIG. 17, the device 700 comprises a base portion 702 that contacts or is coupled to the mass $M_2$ during use. The base portion 702 has an "upper" surface 704 opposite the surface adjacent the mass $M_2$. The base portion 702 desirably has a cylindrical profile.

A flexible diaphragm 706 is mounted to the "upper" surface 704 using a mounting plate 708 or other suitable fastening means. The diaphragm 706 desirably is made of a flexible polymeric material, as described in the first representative embodiment. The mounting plate 708 can be attached to the upper surface 704 using screws or other suitable fastening means.

The periphery of the diaphragm 706 is mounted circumferentially to a bearing ring 710 (also termed a "housing portion") using a sealing ring or other suitable fastening means. The bearing ring 710 in this embodiment desirably has essentially the same overall configuration as the combination of the first and second bearing rings 384, 392, respectively, of the embodiment of FIG. 9 (except that the bearing ring 710 of FIG. 17 is of a unitary structure). The bearing ring 710 desirably is aligned axially with the base portion 702 and defines an opening 712 into which is inserted, in a slidable manner, the piston unit 714. The piston unit 714 includes an "upper" surface 716 that is situated opposite a "lower" surface 718 of the mass $M_1$. The upper surface 716 and the lower surface 718 serve as respective bearing surfaces for the piston unit 714 and the mass $M_1$, respectively.

The base portion 702, diaphragm 706, bearing ring 710, and piston unit 714 desirably have respective cylindrical profile and collectively define an isolator chamber 720. If desired, especially to increase the volume of the isolator chamber 720, the main housing portion 372 of the embodiment of FIG. 9 could be used in lieu of the base portion 702, in which case the diaphragm 380 of FIG. 9 would be used to couple the main housing portion 372 to the bearing ring 710.

During operation, the isolator chamber 720 is pressurized with gas (e.g., air) at a pressure $P_{isol}$ (greater than atmospheric $P_{atm}$). The gas is discharged into the isolator chamber 720 via a conduit 722. The piston unit 714 defines at least one internal fluid passageway 724 that extends from a "lower" surface 738 of the piston unit 714 to the "upper" surface 716 of the piston unit 714. The pressure $P_{isol}$ is sufficiently high relative to atmospheric pressure $P_{atm}$ to cause gas to exit the isolator chamber 720 by flowing through the fluid passageway 724 and passing between the surfaces 716, 718 of the piston unit 714 and the mass $M_1$, respectively, thereby creating a lateral fluid bearing between the surfaces 716, 718. This lateral fluid bearing allows the piston unit 714 and the mass $M_1$ to move laterally (XY-direction) relative to each other, with substantially zero stiffness.

Similar to the embodiment of FIG. 9, a conduit 420 supplies gas to the space between a side surface 416 of the piston unit 714 and a respective inside surface 418 of the bearing ring 710, thereby establishing an axial fluid bearing, which allows the piston unit 714 and the bearing ring 710 to move axially relative to each other, with substantially zero axial stiffness.

In the embodiment of FIG. 17, although the lateral fluid bearing defined between the surfaces 716, 718 is served by the fluid passageway 724 through the piston unit 714, this configuration is not required. For example, the piston unit 714 can define one or more optional lateral fluid passageways 740 that are in fluid communication with the axial fluid bearing defined between the surfaces 416, 418. Each lateral fluid passageway 740 extends from the side surface 416 of the piston unit 714 to a respective longitudinal fluid passageway 742, with each longitudinal fluid passageway 742 being in fluid communication with the lateral fluid bearing defined between the surfaces 716, 718. In this manner, gas flowing from the conduit 420 serves both the axial fluid bearing and the lateral fluid bearing.

During normal operation, pressure fluctuations may occur in the isolator chamber 720. Such pressure fluctuations may be caused, for example, by the cycling of an air compressor being used to supply compressed air to the isolator chamber 720. To control pressure fluctuations, the device 700 may include a control system, indicated generally at 725, for automatically regulating the pressure of the gas that is discharged into the isolator chamber 720 via the conduit 722. As shown in FIG. 17, the control system 725 may comprise, for example, a pressure sensor 726 positioned to detect the pressure $P_{isol}$ in the isolator chamber 720. The pressure sensor 726 is electrically connected to a controller 728, which in turn is electrically connected to a control valve 730. The conduit 722 is fluidly connected to an outlet 732 of the control valve 730. An inlet 734 of the control valve 730 is fluidly connected to a conduit 736 that feeds compressed gas to the control valve 730 from a compressed-gas source (not shown).

The controller 728 is operable to receive a user input value corresponding to the desired pressure of the isolator chamber 720 (e.g., $P_{isol}$). During operation, the controller 728 receives an output signal from the pressure sensor 726 corresponding to the actual pressure in the isolator chamber 720. In response to the output signal, the controller 728 is operable to open and close the control valve 730 automatically so that the pressure in the chamber 720 approximates the desired pressure $P_{isol}$ as closely as possible.

The control system 725 (or an analogous system) can be implemented in any of the vibration-attenuation devices described herein.

Thirteenth Representative Embodiment

Figure 18:
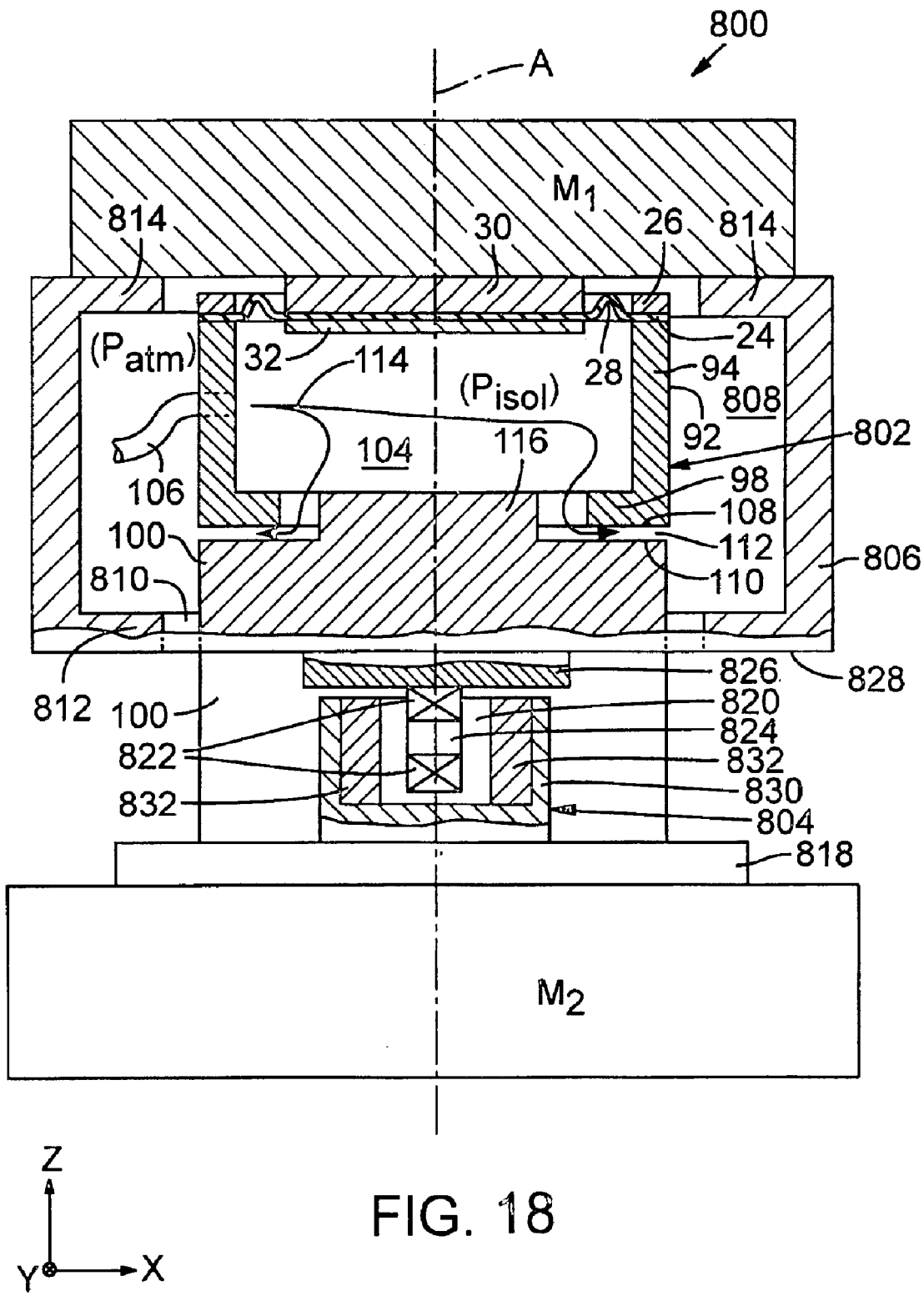
FIG. 18 is an elevational section of a combination vibration-attenuation/positioning device according to a thirteenth representative embodiment.

A device 800 according to this embodiment is shown in FIG. 18. This device combines a fluid isolator, a lateral (XY-direction) substantially zero-stiffness fluid bearing ("XY bearing"), and an active-positioning device capable of causing relative movement between the masses $M_1$ and $M_2$ in the Z-direction. Accordingly, the device 800 may be referred to as an "active vibration-isolation system" ("AVIS").

As shown in FIG. 18, the device 800 comprises a vibration-attenuation device 802 and at least one active mover 804. The active mover 804 allows the first mass $M_1$ and the second mass $M_2$ to be tilted axially relative to each other as the vibration-attenuation device 802 reduces transmission of vibrations from one mass to the other.

The vibration-attenuation device 802 in FIG. 18 is similar in many respects to the vibration-attenuation device 90 of FIG. 3. As such, the components in FIG. 18 that are identical to the corresponding components in FIG. 3 have the same respective reference numerals and are not described further. The vibration-attenuation device 802 differs from the vibration-attenuation device 90 shown in FIG. 3 firstly with respect to the manner in which the diaphragm 24 is secured to the housing 92. Specifically, in the embodiment of FIG. 3 the diaphragm 24 is secured to an inwardly extending first end wall 96 of the housing 92. In contrast, in the embodiment of FIG. 18 the diaphragm 24 is secured to the top edge of the side wall 94 of the housing 92 with a sealing ring 26 (such as shown in the embodiments of FIGS. 1 and 2).

The vibration-attenuation device 802 differs from the vibration-attenuation device 90 of FIG. 3 secondly by including a frame 806 in surrounding relationship to the housing 92 and a portion of the base 100. Thus, the frame 806 defines an interior space 808 (normally at atmospheric pressure $P_{atm}$) in which the housing 92 is located. The frame 806 includes a "bottom" wall 812 that defines an opening 810 through which the base 100 extends from the interior space 808. The frame 806 also includes a "side" wall 816 from which an "upper" flange 814 extends radially inwardly. The mass $M_1$ is in rigid contact with the flange 814 as well as with the mounting plate 30. Thus, in this configuration the mass $M_1$ (and attached frame 806) can move (e.g., tilt) relative to the base 100.

The base 100 is rigidly attached to a "bottom" plate 818 that is in rigid contact with the second mass $M_2$. Thus, since the base 100 is in rigid contact with the mass $M_2$, the masses $M_1$, $M_2$ thus can move (e.g., tilt) relative to each other.

As noted above, the device 800 includes at least one active mover 804 for generating translational movement between the masses $M_1$ and $M_2$ in the Z-direction. Each active mover 804 is mounted to the bottom plate 818 and extends "upward" to a lower surface 828 of the bottom wall 812 of the frame 806. Although, in the illustrated embodiment, only one active mover 804 is shown, desirably the device 800 comprises multiple active movers 804 arranged equidistantly from the axis A and equi-angularly with respect to each other.

The active mover 804 comprises a Lorentz-force actuator, or motor (also known as a "voice-coil motor" or "VCM"). The active mover 804, configured as a "Z-Lorentz-force motor," is positioned to produce a Lorentz force in the Z-direction for supporting and causing movement of the frame 806 (supporting the mass $M_1$) relative to the mass $M_2$ in the Z-direction. Any of various devices other than the illustrated voice-coil motor alternatively may be used as the active mover 804. Accordingly, the active mover 804 may comprise any of various actuators or motors (e.g., electromagnetic, piezoelectric, pneumatic, or the like).

As a VCM, the active mover 804 comprises at least one coil 822 or analogous component mounted to a coil holder 824. The coil holder 824 includes a flange 826 mounted to a "bottom" surface 828 of the wall 812 of the frame 806, thereby effectively connecting the coil(s) 822 of the active mover 804 to the first mass $M_1$. Situated so as to surround the coil(s) 822 (with an intervening gap 820) in a coaxial manner is at least one magnet 832 (desirably a permanent magnet) mounted to a yoke (magnet holder) 830. The yoke 830 is mounted to the bottom plate 818, thereby effectively connecting the magnet(s) to the second mass $M_2$. The magnet(s) 832 radially face the coil(s) 822 but are separated from the magnet(s) 832 by the gap 820. The coil holder 824 can include an internal chamber (not shown) or the like through which a liquid coolant can be circulated so as to cool the coil(s) 822.

In the embodiment of FIG. 18, the active mover 804 is situated relative to the frame 806 and bottom plate 818 such that a force generated by the active mover 804 is directed in the Z-direction along a respective motion axis. During operation of a VCM type of active mover 804, an electrical current is supplied to the coil(s) 822 to generate a Lorentz force between the coil(s) 822 and the magnet(s) 832. The Lorentz force, in turn, urges movement of the frame 806 relative to the bottom plate 818, and thus urges corresponding movement of the mass $M_1$ relative to the mass $M_2$. As noted above, each active mover 804 is displaced radially from the support axis A. Movement, as described above, of a single active mover 804 relative to the other active movers causes a corresponding tilt of the frame 806 relative to the bottom plate 818, and hence a corresponding tilt of the first mass $M_1$ relative to the second mass $M_2$. Hence, the device 800 is capable of generating movement of the mass $M_1$ relative to the mass $M_2$ in at least three degrees of freedom, namely, displacement in the Z-direction, rotation about a rotational axis parallel to the X-direction, and rotation about a rotational axis parallel to the Y-direction (i.e., Z, $\theta_x$, and $\theta_y$ motions, respectively).

Figure 13:
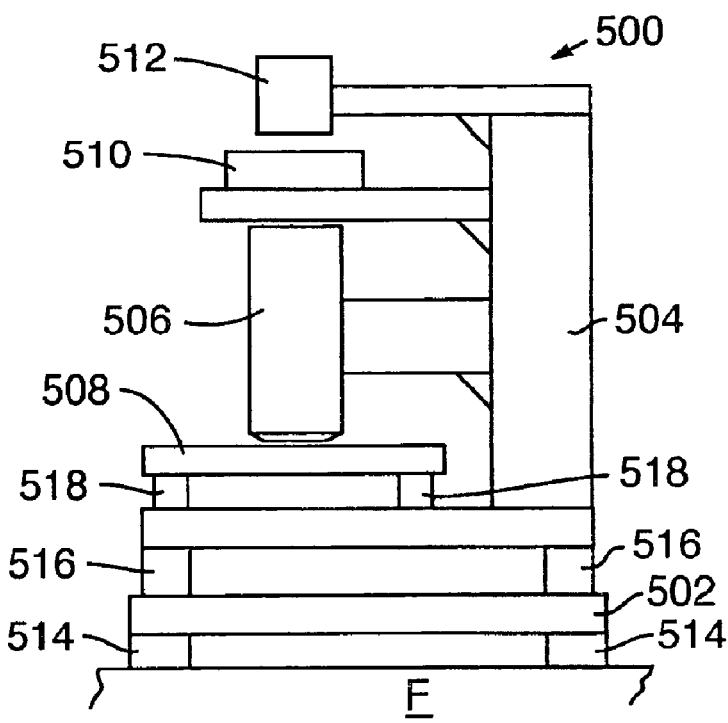
FIG. 13 is a schematic elevational view of a lithographic exposure apparatus according to a sixteenth representative embodiment.

In particular embodiments, a plurality of devices 800 can be positioned between the masses $M_1$ and $M_2$. Reference is made, for example, to FIG. 13, in which a separate device 800 of FIG. 18 can be used for each of the devices 514 situated between the base 502 and the floor F (wherein the first mass $M_1$ corresponds to the base 502 and the second mass $M_2$ corresponds to the floor F, or vice versa). Alternatively or in addition, a separate device 800 can be used for each of the devices 516 in FIG. 13, wherein the first mass $M_1$ corresponds to the optical frame 518 and the second mass $M_2$ corresponds to the base 502 (or vice versa). If three or more devices 800 are positioned at the respective locations between the masses $M_1$, $M_2$, the respective active movers 804 can be actuated controllably to generate movement of the mass $M_1$ relative to the mass $M_2$ in at least three degrees of freedom, namely, displacement in the Z-direction, rotation about a rotational axis parallel to the X-direction, and rotation about a rotational axis parallel to the Y-direction (i.e., Z, $\theta_x$, and $\theta_y$ motions, respectively).

The devices 800 can be used in combination with additional positioning devices or actuators for producing controlled movement of the mass $M_1$ relative to the mass $M_2$ in any of various directions, up to six mutually independent degrees of freedom of motion (X, Y, Z, $\theta_x$, $\theta_y$, $\theta_z$). For example, with such a configuration, the optical frame 518 in FIG. 13 can move in six degrees of freedom with respect to the base 502, and the base 502 can move in six degrees of freedom with respect to the floor F.

In this regard, reference is made to the disclosure in European Patent Publication No. 973,067, incorporated herein by reference. In each device 800, the buoyant force produced by the vibration-attenuation device 802 and the driving force generated by the active movers 804 can be coaxial (along the support axis A). In addition, an X-Lorentz-force motor can be provided that couples the mass $M_1$ to the mass $M_2$ such that energizing the X-Lorentz-force motor displaces the masses $M_1$, $M_2$ relative to each other in the X-direction. Similarly, a Y-Lorentz-force motor can be provided that couples the mass $M_1$ to the mass $M_2$ such that energizing the Y-Lorentz-force motor displaces the masses $M_1$, $M_2$ relative to each other in the Y-direction. The forces generated by the X-Lorentz-force motor and the Y-Lorentz-force motor can be controlled relative to each other to cause a rotation of the mass $M_1$ relative to the mass $M_2$ about a rotation axis parallel to the Z-direction (i.e., rotation in the $\theta_z$-direction). In this configuration the mass $M_1$ thus is movable relative to the mass $M_2$ in six mutually independent degrees of freedom (X, Y, X, $\theta_x$, $\theta_y$, and $\theta_z$).

Figure 19:
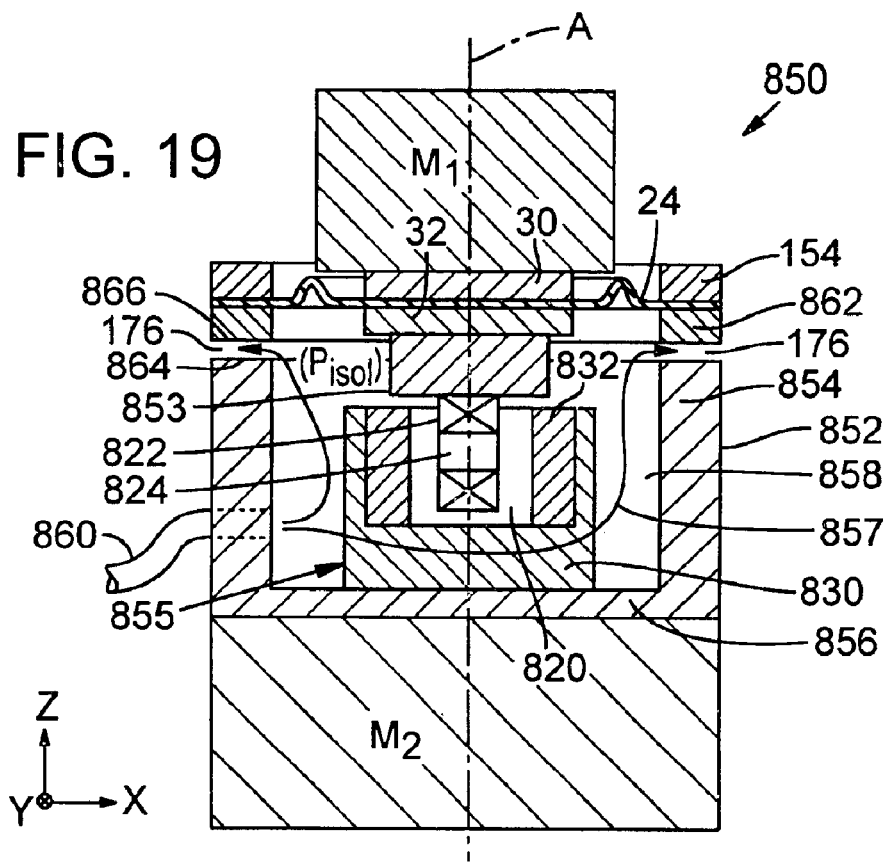
FIG. 19 is an elevational section of a combination vibration-attenuation/positioning device according to a fourteenth representative embodiment.
Figure 20:
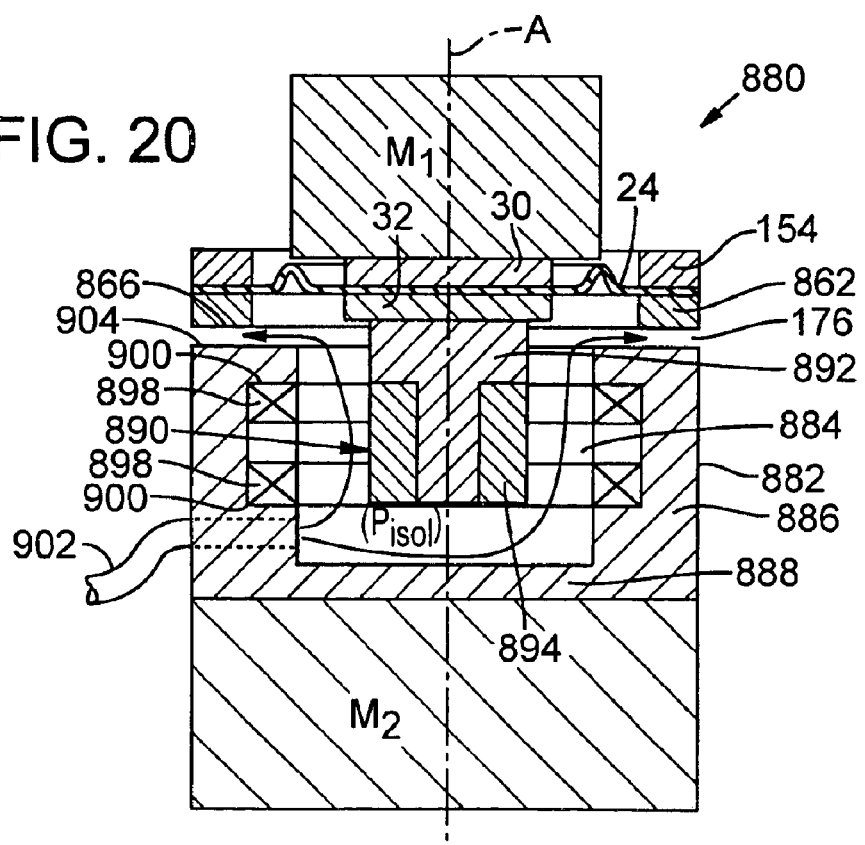
FIG. 20 is an elevational section of a combination vibration-attenuation/positioning device according to a fifteenth representative embodiment.

Active movers 804 can be used in combination with any of various other vibration-attenuation devices disclosed herein. For example, the active mover 818 can be used in combination with the vibration-attenuation device 300 of FIG. 8 so as to provide a device that combines a fluid isolator, a lateral (XY-direction) substantially zero-stiffness fluid bearing ("XY bearing"), an axial (Z-direction) fluid bearing ("Z bearing"), a spherical fluid bearing ("$\theta_{XY}$ bearing"), and a positioning device capable of causing relative movement between the masses $M_1$ and $M_2$ in the Z-direction. FIGS. 19 and 20, described below, illustrate additional embodiments of devices that combine a vibration-attenuation device with a positioning device.

The AVIS device shown in FIG. 18 can be used in a manner as disclosed in U.S. Pat. No. 5,701,041, incorporated herein by reference. In such a configuration the axis of driving force generated by the active mover 804 and the support axis A of the portion 802 can substantially coincide with each other.

Fourteenth Representative Embodiment

FIG. 19 illustrates of a combination vibration-attenuation/positioning device 850 according to another embodiment. The device 850, like the embodiment of FIG. 18, combines a fluid isolator, a lateral (XY-direction) substantially zero-stiffness fluid bearing ("XY bearing"), and a positioning device capable of causing relative movement between the masses $M_1$ and $M_2$ in the Z-direction. A key distinction between the device 850 and the device 800 of FIG. 18 concerns the location of the active mover (positioning device). Specifically, in the embodiment of FIG. 19, the active mover is aligned axially with the vibration-attenuation device along the support axis A. In the embodiment of FIG. 18, the active mover(s) are displaced laterally from the support axis A.

In FIG. 19, components that are similar to respective components shown in FIG. 18 have the same respective reference numerals, and are not described further below.

The device 850 of FIG. 19 comprises a main housing portion 852 and an "upper" housing portion 862. The main housing portion 852 includes a side wall 854 bounded by a "lower" wall 856. The main housing portion 852 and "upper" housing portion 862 desirably are aligned (along the support axis A) with each other as shown and collectively define a chamber 858 in which is disposed an active mover (e.g., Lorentz-force motor) 855. The main housing portion 852 desirably is cylindrical in profile, wherein the outer diameter of the active mover 855 is smaller than the inside diameter of the main housing portion 852. The chamber 858 is bounded above by a diaphragm 24 that is secured to the "upper" housing portion 862 with a sealing ring 154, such as described above in connection with the embodiment of FIG. 5.

Similar to the embodiment of FIG. 5, gas or other fluid is discharged into the chamber 858 via a conduit 860 connected to a suitable source (not shown) of fluid to create the desired pressure $P_{isol}$ in the chamber 858. The pressure $P_{isol}$ is sufficient to support the mass $M_1$, the mounting plates 30, 32, the sealing ring 154, and the upper housing portion 862 relative to the main housing portion 852 (and thus relative to the mass $M_2$). A lateral fluid bearing 176 is created between adjacent surfaces 864 and 866 of the housing portions 852, 862, respectively, due to escape of fluid (arrows 857) from the chamber 858.

With respect to the active mover 855, the coil(s) 822 is mounted to a coil holder 824. A flange 853 extends from the coil holder 824 and is mounted to the second mounting plate 32. The mass $M_1$ is in rigid contact with the first mounting plate 30, which is attached to the second mounting plate 32 with the diaphragm 24 situated therebetween. Radially displaced from the coil(s) 822 (with an intervening gap 820) is at least one permanent magnet 832 mounted to the yoke 830. The yoke 830 is mounted to the lower wall 856 of the main housing portion 852, and the mass $M_2$ is in rigid contact with the "lower" surface of the lower wall 856. Thus, actuation of the active mover 855 causes movement of the masses $M_1$, $M_2$ relative to each other along the support axis A.

Fifteenth Representative Embodiment

A device 880 according to this embodiment is depicted in FIG. 20, in which components that are similar to respective components discussed above have the same respective reference designators. The device 880 combines a fluid isolator, a lateral (XY-direction) substantially zero-stiffness fluid bearing ("XY bearing"), and a positioning device capable of causing relative movement between the masses $M_1$ and $M_2$ in the Z-direction. The device 880, which is similar in many ways to the device 850 of FIG. 19, illustrates the use of an alternative configuration of a Lorentz-force motor as an active mover.

In FIG. 20 the device 880 comprises a main housing portion 882 and an "upper" housing portion 862 that collectively define a chamber 884 for housing an active mover (e.g., Lorentz-force motor) 890. The main housing portion 882 includes a side wall 886 and a "lower" wall 888 that is in rigid contact with the mass $M_2$. The active mover 890 in the illustrated configuration comprises a centrally disposed yoke 892 that supports one or more permanent magnets 894. The yoke 892 is mounted to the second mounting plate 32 in the manner described above. The active mover 890 also includes multiple coils 898 supported by the side wall 886 of the main housing portion 882 in a concentric manner about the magnet(s) 894. The coils 898 desirably are disposed in respective recesses 900 defined in the side wall 886, as shown. In this manner, the side wall 886 serves as a holder for the coil(s) 898.

Gas or other suitable fluid is discharged into the chamber 884 via a conduit 902. The resulting pressure $P_{isol}$ in the chamber 84 escaping between the adjacent surfaces 904, 866 of the housing portions 882, 862, respectively, creates a lateral fluid bearing 176, thereby creating a fluid isolator between the masses $M_1$, $M_2$. Actuation of the active mover 890 causes the magnet(s) to move relative to the coil(s) 898 along the support axis A, thereby urging the masses $M_1$, $M_2$ to move relative to each other along the support axis A.

Sixteenth Representative Embodiment

As noted above, vibration-attenuation devices as disclosed herein can be used in any of various types of machines in which the particular capabilities of the devices can be exploited beneficially. Due to the extremely high-accuracy performance demanded of current stepper machines, an especially important application of the subject vibration-attenuation devices is in a stepper machine.

A stepper machine (also generally termed a "lithographic exposure apparatus") 500 is depicted in FIG. 13 showing an exemplary manner in which vibration-attenuation devices can be employed. It will be understood, however, that the FIG. 13 configuration is not intended to be limiting in any way. The vibration-attenuation devices can be utilized in any of various locations of the machine as conditions indicate.

In FIG. 13, the machine 500 includes a base 502 to which a support frame 504 is attached. Mounted to the base 502 is a wafer-stage assembly 508 situated and configured to hold a wafer or other suitable substrate for exposure at an appropriate location relative to a projection-optical system 506 (also generally termed a "lens assembly"). The projection-optical system 506 can be supported above the wafer-stage assembly 508 using an optical frame 518. Mounted to the support frame 504, upstream of the projection-optical system 506, is a reticle-stage assembly 510 configured to hold a pattern-defining reticle or mask relative to the projection-optical system 506. Situated upstream of the reticle-stage assembly 510 is an illumination-optical system 512 that also can be supported by the support frame 504. Between the base 502 and the floor F of a room enclosing the machine 500 are multiple vibration-attenuation devices 514 configured, for example, according to any of the representative embodiments described above. For best results, the number of devices 514 situated between the base 502 and floor F is at least three (e.g., four, wherein a respective device 514 is located at each corner of the base 502).

FIG. 13 also depicts vibration-attenuation devices 516 situated between the optical frame 518 and the base 502. For best results, the number of vibration-attenuation devices 516 is at least three. The vibration-attenuation devices 516 can be configured according to any of the representative embodiments described above.

Seventeenth Representative Embodiment

Figure 14:
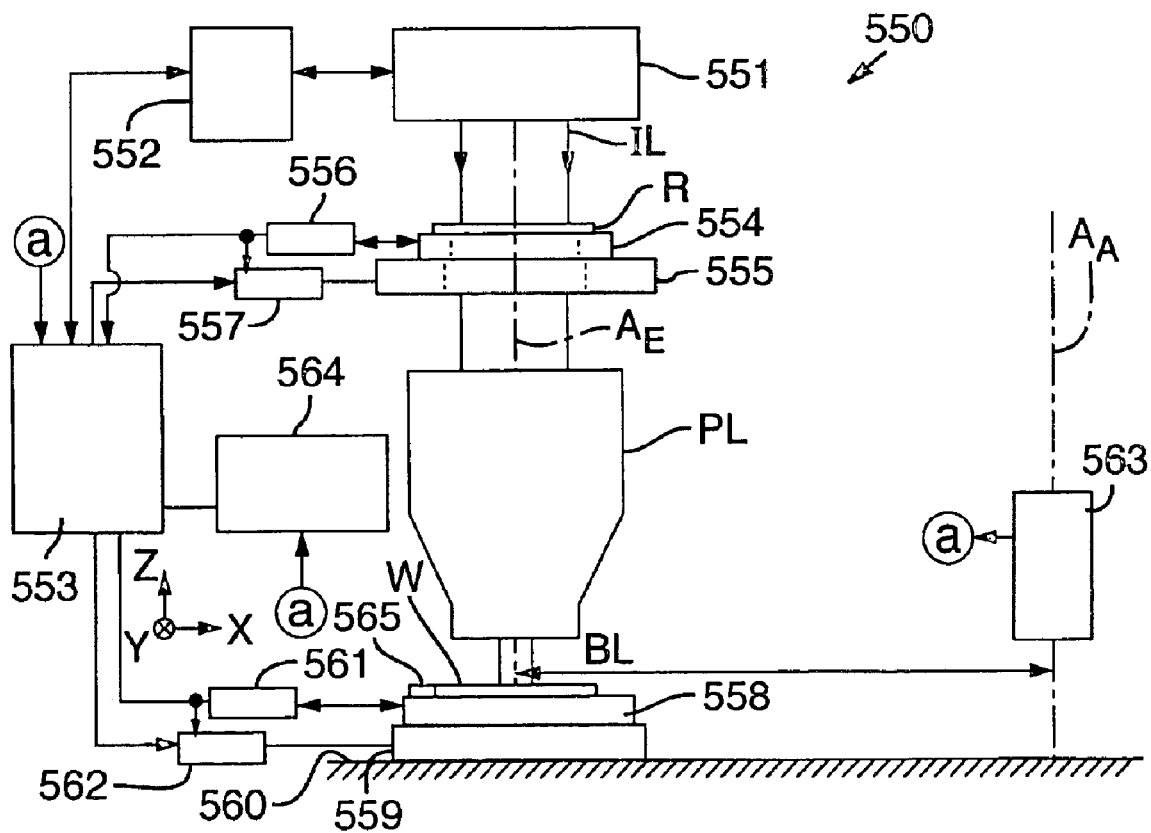
FIG. 14 is a schematic elevational view of a lithographic exposure apparatus according to a seventeenth representative embodiment.

A "stepper" machine (lithographic exposure apparatus) 550 with which any of the foregoing embodiments can be used is depicted in more detail in FIG. 14. Many of the components and their interrelationships in this apparatus are known in the art, and hence are not described in detail herein.

For exposure an illumination "light" IL is produced and directed by an illumination-optical system 551 to irradiate a selected region of a reticle R. The illumination-optical system 551 typically comprises an exposure-light source (e.g., ultraviolet light source, extreme ultraviolet light source, charged-particle-beam source), an integrator, a variable field stop, and a condenser lens system or the like. An image of the irradiated portion of the reticle R is projected by a projection-optical system PL onto a corresponding region of a wafer W or other suitable substrate. So as to be imprinted with the image, the upstream-facing surface of the wafer W is coated with a suitable resist. The projection-optical system PL has a projection magnification $\beta$ ($\beta=\frac{1}{5}$ or $\frac{1}{4}$, for example). An exposure controller 552 is connected to the illumination-optical system 551 and operates to optimize the exposure dose on the wafer W, based on control data produced and routed to the exposure controller 552 by a main control system 553.

In the stepper machine 550 depicted in FIG. 14, the Z-axis extends parallel to an optical axis $A_E$ of the projection-optical system PL, the X-axis extends laterally across the plane of the page perpendicularly to the Z-axis, and the Y-axis extends perpendicularly to the plane of the page. The reticle R is mounted on a reticle stage 554, which is operable to position the reticle R relative to a base 555 in the X- and Y-axis directions. The reticle stage 554 also is operable to rotate the reticle R as required about the Z-axis, based on control data routed to the reticle stage 554 by a reticle-stage driver 557 connected to the reticle stage 554. The control data produced by the reticle-stage driver 557 is based upon reticle-stage coordinates as measured by a laser interferometer 556.

The wafer W is mounted to a wafer holder such as a wafer chuck (not detailed), which in turn is mounted to a wafer table 558. The wafer table 558 is mounted to a wafer stage 559 configured to move the wafer table 558 (with wafer chuck) in the X- and Y-axis directions relative to a base 560 supported on vibration-attenuation devices (not shown, but see FIG. 13) relative to a floor or the like. The wafer table 558 is operable to move the wafer chuck and wafer W in the Z-axis direction (focusing direction) relative to the projection-optical system PL. The wafer table 558 also is operable, as part of an auto-focus system (not detailed), to tilt the wafer W relative to the optical axis $A_E$ so as to place the wafer surface properly for imaging by the projection-optical system PL. The wafer stage 559 is operable to move the wafer table 558 in a stepping manner in the X- and Y-axis directions, as controlled by a wafer-stage driver 562 connected to the wafer stage 559. The wafer-stage driver 562 receives data concerning the X-Y position of the wafer table 558 as measured by a laser interferometer 561. Exposure of individual shot areas on the wafer W is achieved by performing a respective stepping motion of the wafer stage 559 followed by exposure of an image of the pattern on the reticle R in a step-and-repeat manner.

Typical fabrication processes for microelectronic devices and displays involve multiple microlithography steps of respective patterns onto the wafer in a superposed manner. After exposing a pattern of a particular layer onto the wafer surface, and at time of exposing a pattern of a subsequent layer, alignment of the reticle R and wafer W should be performed before exposing the subsequent layer. For such a purpose, a reference-mark member 565, defining one or more reference marks, is provided on the wafer table 558. The reticle R is aligned with the reference-mark member 565, based upon alignment measurements obtained using a reticle-alignment microscope (not shown). An alignment sensor 563 (desirably an image-processing type) is situated adjacent the projection-optical system PL and has an axis $A_A$ that is parallel to the axis $A_E$. The alignment sensor 563 desirably comprises an image-pickup device (not detailed) that produces an image signal that is routed to an alignment-signal processor 564. The alignment-signal processor 564 determines respective alignment positions of alignment marks on the wafer W relative to corresponding index marks. The image-processing performance of the alignment-signal processor 564 is disclosed in, for example, U.S. Pat. No. 5,493,403, incorporated herein by reference. An exemplary structure of the reference-mark member 565 and its use for alignment purposes and the like are disclosed in U.S. Pat. No. 5,243,195, incorporated herein by reference.

The stepper machine 550 shown in FIG. 14 can be any of various types of microlithography apparatus. For example, as an alternative to operating in a "step-and-repeat" manner characteristic of steppers, the machine 550 can be a scanning-type microlithography apparatus operable to expose the pattern from the reticle R to the wafer W while continuously scanning both the reticle R and wafer W in a synchronous manner. During such scanning, the reticle R and wafer W are moved synchronously in opposite directions perpendicular to the optical axis $A_E$. The scanning motions are performed by the respective stages 554, 559.

In contrast, a step-and-repeat microlithography apparatus performs exposure only while the reticle R and wafer W are stationary. If the microlithography apparatus is an "optical lithography" apparatus, the wafer W typically is in a constant position relative to the reticle R and projection-optical system PL during exposure of a given pattern field. After the particular pattern field is exposed, the wafer W is moved, perpendicularly to the optical axis $A_E$ and relative to the reticle R, to place the next field of the wafer W into position for exposure. In such a manner, images of the reticle pattern are exposed sequentially onto respective fields on the wafer W.

Pattern-exposure apparatus as provided herein are not limited to microlithography apparatus for manufacturing microelectronic devices. As a first alternative, for example, the apparatus can be a liquid-crystal-device (LCD) microlithography apparatus used for exposing a pattern for a liquid-crystal display onto a glass plate. As a second alternative, the apparatus can be a microlithography apparatus used for manufacturing thin-film magnetic heads. As a third alternative, the apparatus can be a proximity-microlithography apparatus used for exposing, for example, a mask pattern. In this alternative, the mask and substrate are placed in close proximity with each other, and exposure is performed without having to use a projection-optical system PL.

The principles of the invention as described above further alternatively can be used with any of various other apparatus, including (but not limited to) other microelectronic-processing apparatus, machine tools, metal-cutting equipment, and inspection apparatus.

In any of various microlithography apparatus as described above, the source (in the illumination-optical system 551) of illumination "light" can be, for example, a g-line source (438 nm), an i-line source (365 nm), a KrF excimer laser (248 nm), an ArF excimer laser (193 nm), or an $F_2$ excimer laser (157 nm). Alternatively, the source can be of a charged particle beam such as an electron or ion beam, or a source of X-rays (including "extreme ultraviolet" radiation). If the source produces an electron beam, then the source can be a thermionic-emission type (e.g., lanthanum hexaboride or $LaB_6$ or tantalum (Ta)) of electron gun. If the illumination "light" is an electron beam, the pattern can be transferred to the wafer W from the reticle R or directly to the wafer W without using a reticle.

With respect to the projection-optical system PL, if the illumination light comprises far-ultraviolet radiation, the constituent lenses are made of UV-transmissive materials such as quartz and fluorite that readily transmit ultraviolet radiation. If the illumination light is produced by an $F_2$ excimer laser or EUV source, then the lenses of the projection-optical system PL can be either refractive or catadioptric, and the reticle R desirably is a reflective type. If the illumination "light" is an electron beam (as a representative charged particle beam), then the projection-optical system PL typically comprises various charged-particle-beam optics such as electron lenses and deflectors, and the optical path should be in a suitable vacuum. If the illumination light is in the vacuum ultraviolet (VUV) range (less than 200 nm), then the projection-optical system PL can have a catadioptric configuration with beam splitter and concave mirror, as disclosed for example in U.S. Pat. Nos. 5,668,672 and 5,835,275, incorporated herein by reference. The projection-optical system PL also can have a reflecting-refracting configuration including a concave mirror but not a beam splitter, as disclosed in U.S. Pat. Nos. 5,689,377 and 5,892,117, incorporated herein by reference.

Either or both the reticle stage 554 and wafer stage 559 can include respective linear motors for achieving the motions of the reticle R and wafer W, respectively, in the X-axis and Y-axis directions. The linear motors can be air-levitation types (employing air bearings) or magnetic-levitation types (employing bearings based on the Lorentz force or a reactance force). Either or both stages 554, 559 can be configured to move along a respective guide or alternatively can be guideless. See U.S. Pat. Nos. 5,623,853 and 5,528,118, incorporated herein by reference.

Further alternatively, either or both stages 554, 559 can be driven by a planar motor that drives the respective stage by electromagnetic force generated by a magnet unit having two-dimensionally arranged magnets and an armature-coil unit having two-dimensionally arranged coils in facing positions. With such a drive system, either the magnet unit or the armature-coil unit is connected to the respective stage and the other unit is mounted on a moving-plane side of the respective stage.

Movement of a stage 554, 559 as described herein can generate reaction forces that can affect the performance of the microlithography apparatus. Reaction forces generated by motion of the wafer stage 559 can be attenuated using any of the vibration-attenuation devices described above. Alternatively, the reaction forces can be shunted to the floor (ground) using a frame member as described, e.g., in U.S. Pat. No. 5,528,118, incorporated herein by reference. Reaction forces generated by motion of the reticle stage 554 can be attenuated using any of the vibration-attenuation devices described above or shunted to the floor (ground) using a frame member as described in U.S. Pat. No. 5,874,820, incorporated herein by reference.

Still alternatively, the stages 554, 559 (or other components of the stepper machine 550) can be mounted on a plurality of combination vibration-attenuation/positioning devices, such as those shown in FIGS. 18, 19, and 20, for moving the stages while attenuating vibration forces. In one approach, for example, either or both of the stages 554, 559 are mounted on three combination vibration-attenuation/positioning devices, each having a positioning device such as a Lorentz-force motor. By selectively controlling the moving forces generated by the Lorentz-force motors operating in the Z-direction, the stages 554, 559 can be displaced in the Z-direction, rotated in the $\theta_x$-direction, or rotated in the $\theta_y$-direction. In addition, respective Lorentz-force motors operating in the X-direction and Y-direction can be used to generate displacements of the stages 554, 559 in the X-direction and Y-direction, respectively, and rotations in the $\theta_z$-direction, such as described in European Patent Application No. 973,067, incorporated herein by reference. In this manner, the stages 554, 559 can be moved with six mutually independent degrees of freedom (i.e., X, Y, Z, $\theta_x$, $\theta_y$, and $\theta_z$).

A microlithography apparatus such as any of the various types described above can be constructed by assembling together the various subsystems, including any of the elements listed in the appended claims, in a manner ensuring that the prescribed mechanical accuracy, electrical accuracy, and optical accuracy are obtained and maintained. For example, to maintain the various accuracy specifications, before and after assembly, optical system components and assemblies are adjusted as required to achieve maximal optical accuracy. Similarly, mechanical and electrical systems are adjusted as required to achieve maximal respective accuracies. Assembling the various subsystems into a microlithography apparatus requires the making of mechanical interfaces, electrical-circuit wiring connections, and pneumatic plumbing connections as required between the various subsystems. Typically, constituent subsystems are assembled prior to assembling the subsystems into a microlithography apparatus. After assembly of the apparatus, system adjustments are made as required for achieving overall system specifications in accuracy, etc. Assembly at the subsystem and system levels desirably is performed in a clean room where temperature and humidity are controlled.

Eighteenth Representative Embodiment

Figure 15:
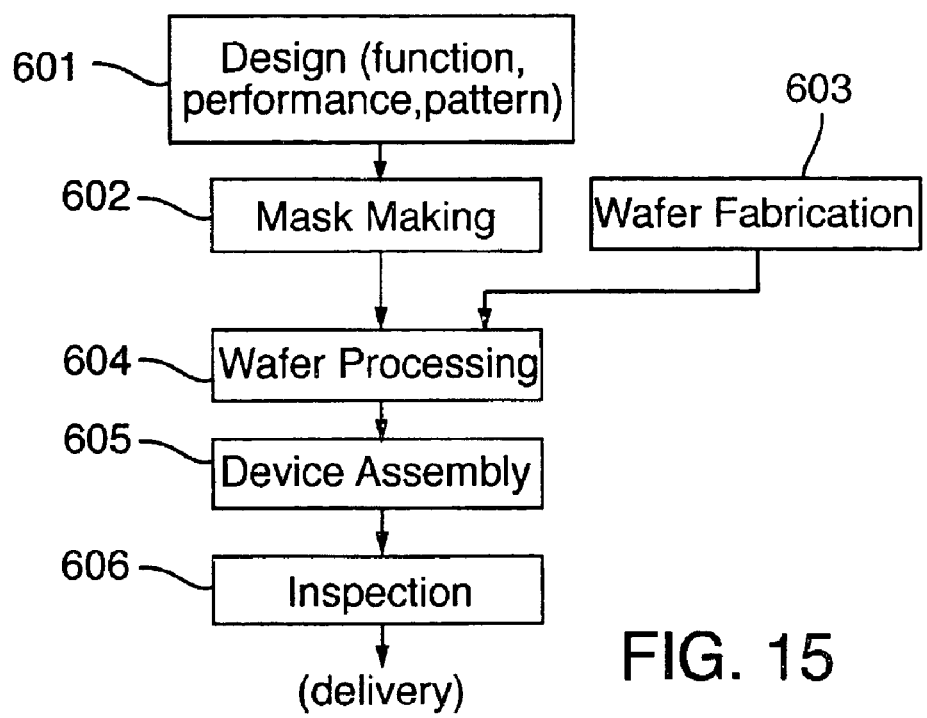
FIG. 15 is a block diagram of certain steps in a microelectronic-device fabrication process according to an eighteenth representative embodiment.

Any of various microelectronic devices and displays can be fabricated using an apparatus as described in the seventeenth representative embodiment. An exemplary process is depicted in FIG. 15. In step 601, the function and performance characteristics of the subject device are designed. Next, in step 602, a mask (reticle) defining a corresponding pattern is designed according to the specifications established in the preceding step. In a parallel step 603 to step 602, a wafer or other suitable substrate is made. In step 604 the mask pattern designed in step 602 is exposed onto the wafer using a microlithography apparatus as described herein. In step 605 the microelectronic device is assembled; this typically includes dicing, bonding, and packaging steps as well known in the art. Finally, in step 606, the devices are inspected.

Figure 16:
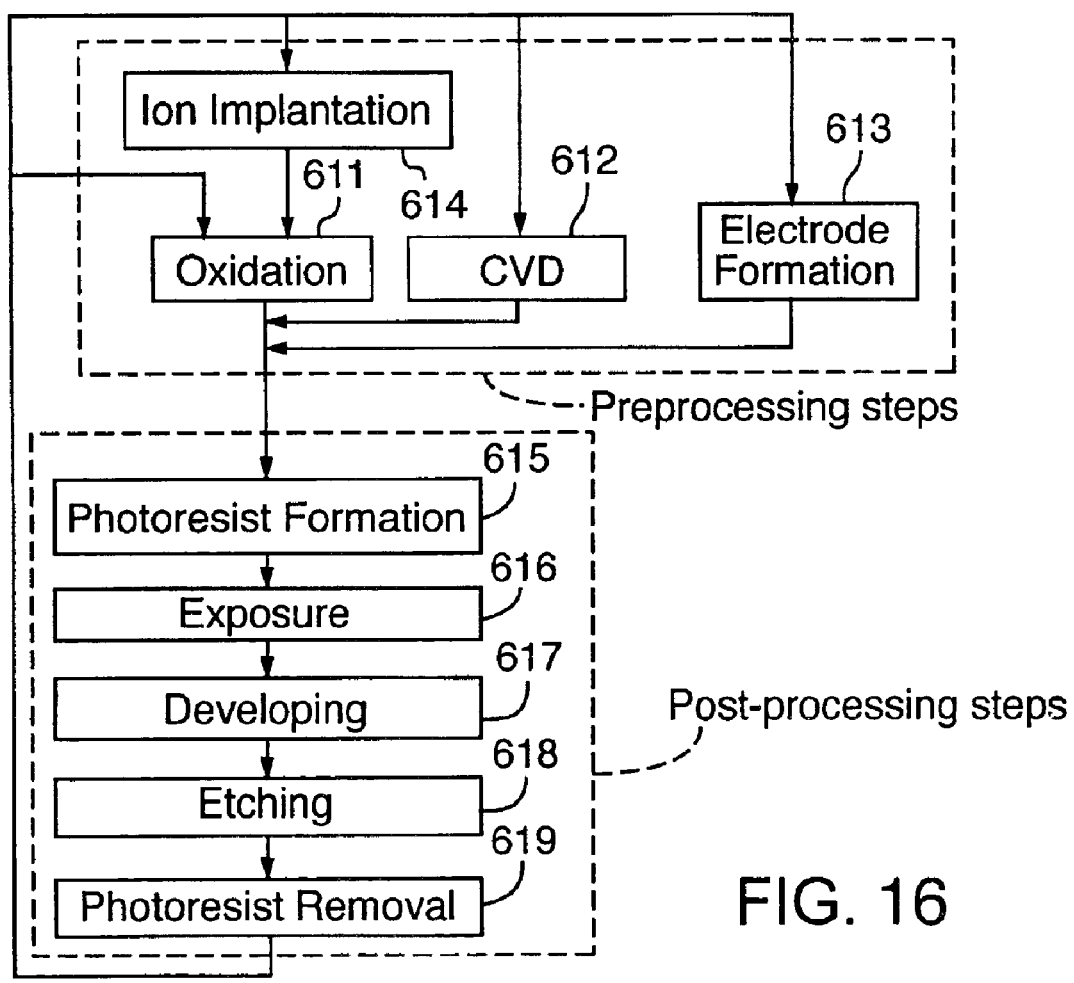
FIG. 16 is a block diagram of details of step 604 in FIG. 15.

FIG. 16 is a flow chart of details of step 604, as applied to manufacturing microelectronic devices. In step 611 (oxidation) the surface of the wafer is oxidized. In step 612 ("CVD" or chemical vapor deposition) an insulating film is formed on the wafer surface. In step 613 (electrode formation) electrodes are formed on the wafer by vapor deposition. In step 614 (ion implantation) ions are implanted in the wafer. These steps 611-614 constitute the "pre-process" steps for wafers during wafer processing; during these steps selections are made as required according to processing requirements.

Continuing further with FIG. 16, at each stage of wafer processing, after the above-mentioned pre-process steps are completed, the following "post-process" steps are executed. Initially, in step 615 (photoresist formation), a layer of a suitable resist is applied to the wafer surface. Next, in step 616 (exposure), the microlithography apparatus is used to transfer the circuit pattern defined by the mask (reticle) to the wafer. In step 617 (developing) the exposed layer of resist on the wafer surface is developed. In step 618 (etching), portions of the wafer surface not protected by residual resist are removed by etching. In step 619 (photoresist removal) any resist remaining after completing the etching step is removed.

Multiple circuit patterns are formed on the wafer surface by repeating these pre-process and post-process steps as required.

Whereas the invention has been described in connection with multiple representative embodiments, it will be understood that the invention is not limited to those embodiments. On the contrary, the invention is intended to encompass all modifications, alternatives, and equivalents as may be included within the spirit and scope of the invention, as defined by the appended claims.

What is claimed:

1. A device for supporting a first mass relative to a second mass, comprising:

a fluid isolator and a lateral fluid bearing situated along a support axis between the first and second masses;

the fluid isolator comprising a housing defining an isolator chamber configured to be pressurized with a fluid at a pressure ($P_{isol}$), the fluid isolator being situated and configured relative to the first mass, the second mass, and the lateral fluid bearing such that motion of the masses relative to each other along the support axis is at the fluid isolator, and lateral motion of the masses relative to each other is at the lateral fluid bearing; and the lateral fluid bearing comprising first and second bearing surfaces oriented transversely to the support axis, at least one of the first and second bearing surfaces defining a pressure channel, an atmospheric pressure channel, and a vacuum channel, the pressure channel being situated the closest of the channels to the isolator chamber and pressurized at a pressure ($P_{XYbearing}$) substantially equal to $P_{isol}$; the vacuum channel being situated the farthest of the channels from the isolator chamber and evacuated to a vacuum ($P_{vac}$); and the atmospheric pressure channel being situated between the pressure channel and the vacuum channel and vented to atmospheric pressure ($P_{atm}$).

2. The device of claim 1, wherein:

the pressure channel is separated from the isolator chamber by an inner rib;

the vacuum channel is separated from the isolator chamber by the inner rib as well as first and second intermediate ribs; and the atmospheric pressure channel is separated from the pressure channel and the vacuum channel by the first and second intermediate ribs, respectively.

3. The device of claim 1, wherein:

the housing of the fluid isolator comprises a first housing portion coupled to the first mass, and a second housing portion coupled to the second mass; and the lateral fluid bearing is situated between the first and second housing portions such that the first housing portion is coupled to the first bearing surface and the second housing portion is coupled to the second bearing surface.

4. The device of claim 3, wherein the second housing portion comprises a spherical bearing situated between the lateral fluid bearing and the second mass.

5. The device of claim 4, wherein:

the spherical bearing is defined by first and second spherical bearing surfaces of the second housing portion; and at least one of the first and second spherical bearing surfaces defines a pressure channel pressurized to a pressure ($P_{\theta XYbearing}$) substantially equal to $P_{isol}$, an atmospheric pressure channel vented to atmospheric pressure ($P_{atm}$), and a vacuum channel evacuated to a vacuum ($P_{vac}$).

6. The device of claim 3, further comprising a first flexible diaphragm situated coaxially with the first housing portion and that defines, collectively with the first and second housing portions, the isolator chamber.

7. The device of claim 1, wherein the first housing portion comprises a fluid bearing oriented along the support axis and a piston movable along the support axis relative to the first housing portion.

8. The device of claim 7, further comprising a compliant member situated between the first mass and the piston.

9. The device of claim 7, wherein:

the fluid bearing is defined by a bearing surface of the first housing portion and a bearing surface of the piston; and at least one of the bearing surfaces defines a channel configured to be pressurized to a hyperatmospheric pressure ($P_{Zbearing}$).

10. The device of claim 7, wherein:
the fluid bearing is defined by first and second bearing surfaces;
the piston comprises a first portion and a second portion, the first portion being coupled to the first mass and the second portion defining one of the bearing surfaces; and
the first and second portions define a spherical bearing therebetween.

11. The device of claim 1, further comprising a base support and a flexible diaphragm situated coaxially with the housing, the flexible diaphragm extending from and connecting the housing to the base support.

12. The device of claim 11, further comprising at least one actuator situated so as to apply a force to the second housing portion relative to the base support, the force being sufficient in magnitude and direction to cause the second housing portion to exhibit a corresponding tilt relative to the base support.

13. The device of claim 11, further comprising at least one compliant member situated so as to provide compliant contact of the second housing portion with the second mass and configured to allow the second housing portion to tilt relative to the axis in response to a non-axial force applied to the second housing portion.

14. The device of claim 13, further comprising a base support and a second flexible diaphragm situated coaxially with the second housing portion, the second flexible diaphragm extending from and connecting the second housing portion to the base support.

15. The device of claim 14, further comprising at least one actuator situated so as to apply a force to the second housing portion relative to the base support, the force being sufficient in magnitude and direction to cause the second housing portion to exhibit a corresponding tilt relative to the base support.

16. The device of claim 14, wherein the base support defines a cavity that is open to the isolator chamber.

17. The device of claim 1, further comprising a flexible diaphragm situated coaxially with the housing and that defines, collectively with the housing, the isolator chamber.

18. The device of claim 17, wherein the housing is connected via the flexible diaphragm to the first mass.

19. The device of claim 1, wherein the first bearing surface is defined on a surface of the housing external to the isolator chamber.

20. The device of claim 19, wherein the second bearing surface is defined on a surface of the second housing situated, coaxially with the housing of the fluid isolator, between the first bearing surface and the second mass, the second housing and first bearing surface collectively defining a second chamber configured to be pressurized with a gas at a pressure ($P_{XYbearing}$).

21. The device of claim 20, further comprising a spherical fluid bearing situated between the second housing and the second mass.

22. The device of claim 21, further comprising at least one actuator situated so as to apply a force to the second housing relative to the second mass, the force being sufficient in magnitude and direction to cause the second housing to exhibit a corresponding tilting motion on the spherical bearing relative to the second mass.

23. The device of claim 20, further comprising a compliant member situated between the second housing and the second mass.

24. A lithographic exposure device, comprising a vibration-attenuation device as recited in claim 1.

25. A device for supporting a first mass relative to a second mass, the device comprising:
a fluid isolator and a fluid bearing situated along a support axis between the first mass and the second mass;
the fluid isolator comprising a housing defining an isolator chamber configured to be pressurized with a fluid at a predetermined pressure sufficient to support the first mass relative to the second mass along the support axis; and
the fluid bearing being situated and configured to allow relative movement between the first and second masses in a direction that intersects the support axis, the fluid bearing comprising first and second bearing surfaces oriented relative to the support axis, at least one of the first and second bearing surfaces defining a first pressure conduit and a second pressure conduit, the first pressure conduit being situated the closest of the conduits to the isolator chamber and pressurized at a first pressure substantially equal to the predetermined pressure of the fluid isolator, the second pressure conduit being situated the farthest of the conduits from the isolator chamber and pressurized at a second pressure less than the first pressure.

26. The device of claim 25, wherein the first and second bearing surfaces are oriented substantially transversely relative to the support axis.

27. The device of claim 25, further comprising a third pressure conduit defined in at least one of the first and second bearing surfaces and situated between the first pressure conduit and the second pressure conduit, the third pressure conduit being pressurized at a third pressure between the first pressure and the second pressure.

28. The device of claim 25, further comprising at least one positioning device configured to generate a moving force for causing movement of the first and second masses relative to each other along a moving axis parallel to the support axis.

29. The device of claim 28, wherein the moving axis is generally coincident to the support axis.

30. The device of claim 28, wherein the positioning device is axially aligned with the housing along the support axis.

31. The device of claim 28, wherein the positioning device is disposed in the isolator chamber.

32. The device of claim 25, further comprising an indicator situated and configured to indicate a condition between the first bearing surface and the second bearing surface.

33. A lithographic exposure apparatus, comprising a device as recited in claim 25.

34. An object manufactured using the lithographic exposure apparatus of claim 33.

35. A device for supporting a first mass relative to a second mass, the device comprising:
a first housing coupled to the first mass, the first housing defining a first chamber configured to be pressurized with a first fluid;
a second housing coupled to the second mass and situated along a support axis relative to the first housing between the first and second masses, the second housing defining a second chamber configured to be pressurized with a second fluid, the second chamber being fluidly disconnected from the first chamber; and
a fluid bearing defined between the first and second housings, the fluid bearing allowing movement of the first and second masses relative to each other in a direction that intersects the support axis.

36. The device of claim 35, wherein the fluid bearing is pressurized with fluid discharged from one of the first and second chambers.

37. The device of claim 35, wherein the fluid bearing is a lateral fluid bearing allowing movement of the first and second masses relative to each other in a direction generally perpendicular to the support axis.

38. A lithographic exposure apparatus, comprising the device of claim 35.

39. An object manufactured using the apparatus of claim 38.

* * * * *